(12) United States Patent
Thompson

(10) Patent No.: US 11,631,784 B2
(45) Date of Patent: Apr. 18, 2023

(54) 3-D STRUCTURE FOR INCREASING CONTACT SURFACE AREA FOR LEDS

(71) Applicant: Meta Platforms Technologies, LLC, Menlo Park, CA (US)

(72) Inventor: Daniel Bryce Thompson, Cork (IE)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 17/504,393

(22) Filed: Oct. 18, 2021

(65) Prior Publication Data

US 2022/0037557 A1 Feb. 3, 2022

Related U.S. Application Data

(62) Division of application No. 16/810,457, filed on Mar. 5, 2020, now Pat. No. 11,164,995.

(Continued)

(51) Int. Cl.
*H01L 33/00* (2010.01)
*H01L 33/20* (2010.01)
(Continued)

(52) U.S. Cl.
CPC .......... *H01L 33/20* (2013.01); *H01L 33/0062* (2013.01); *H01L 33/30* (2013.01); *H01L 33/32* (2013.01)

(58) Field of Classification Search
CPC ... H01L 33/0062; H01L 33/30; H01L 27/156; H01L 33/32; H01L 33/20;
(Continued)

(56) References Cited

U.S. PATENT DOCUMENTS 10,418,510 B1 9/2019 Oyer et al.
10,586,887 B2 3/2020 Cho et al.
(Continued)

FOREIGN PATENT DOCUMENTS

WO 2021167753 8/2021

OTHER PUBLICATIONS

Notice of Allowance dated Aug. 27, 2021 for U.S. Appl. No. 16/810,457, filed Mar. 5, 2020, 2 Pages.
(Continued)

*Primary Examiner* — Savitri Mulpuri
(74) *Attorney, Agent, or Firm* — Weaver Austin Villeneuve & Sampson LLP

(57) ABSTRACT

Disclosed herein is an apparatus including a first three-dimensional (3-D) structure, a second 3-D structure, and a conductive layer. The first 3D structure includes a first-type doped semiconductor material having a semi-polar facet. The second 3-D structure forms a light-emitting diode (LED) and includes a second-type doped semiconductor material, an active layer, and the first-type doped semiconductor material. The conductive layer at least partially overlays and is in ohmic contact with the semi-polar facet. The conductive layer is configured to carry current that flows between the semi-polar facet and the active layer. In some embodiments, the first-type doped semiconductor material may include an N-type doped semiconductor material, and the second-type doped semiconductor material may include a P-type doped semiconductor material. The first-type doped semiconductor material of both 3-D structures may be etched from a common first-type doped semiconductor epitaxial layer.

20 Claims, 15 Drawing Sheets

Related U.S. Application Data

(60) Provisional application No. 62/978,984, filed on Feb. 20, 2020.

(51) Int. Cl.
*H01L 33/32* (2010.01)
*H01L 33/30* (2010.01)

(58) Field of Classification Search
CPC ........... H01L 2933/0016; H01L 33/005; H01L 33/385; H01L 33/16; H01L 2933/0066; H01L 33/62; H01L 33/08
See application file for complete search history.

(56) References Cited

U.S. PATENT DOCUMENTS

| | | |
|---|---|---|
| 10,718,886 B1 | 7/2020 | Sharma et al. |
| 10,763,389 B1 * | 9/2020 | Thompson .............. H01L 33/38 |
| 10,923,630 B1 | 2/2021 | Pynn et al. |
| 11,101,418 B1 | 8/2021 | Thompson et al. |
| 2008/0217635 A1 | 9/2008 | Emerson et al. |
| 2012/0061694 A1 | 3/2012 | Shen et al. |
| 2014/0175465 A1 | 6/2014 | Lee et al. |
| 2014/0209956 A1 | 7/2014 | Cho et al. |
| 2014/0332820 A1 | 11/2014 | Han et al. |
| 2015/0099317 A1 | 4/2015 | Hayakawa et al. |
| 2015/0144875 A1 | 5/2015 | Zhong et al. |
| 2020/0313042 A1 | 10/2020 | Ferret et al. |
| 2020/0357972 A1 * | 11/2020 | Lutgen ................ H01L 33/0062 |
| 2020/0373461 A1 | 11/2020 | Tan et al. |
| 2021/0265526 A1 | 8/2021 | Thompson |

OTHER PUBLICATIONS

Notice of Allowance dated May 8, 2020 in U.S. Appl. No. 16/437,567.
Notice of Allowance dated Apr. 14, 2021 in U.S. Appl. No. 16/566,750.
Notice of Allowance dated May 14, 2021 in U.S. Appl. No. 16/810,457.
Notice of Allowance dated Jul. 1, 2021 in U.S. Appl. No. 16/810,457.
PCT Application No. PCT/US2021/014948, "International Search Report and Written Opinion", dated May 20, 2021, 12 pages.
Notice of Allowance dated Nov. 18, 2022 for U.S. Appl. No. 17/374,767, filed Jul. 13, 2021, 8 pages.

* cited by examiner

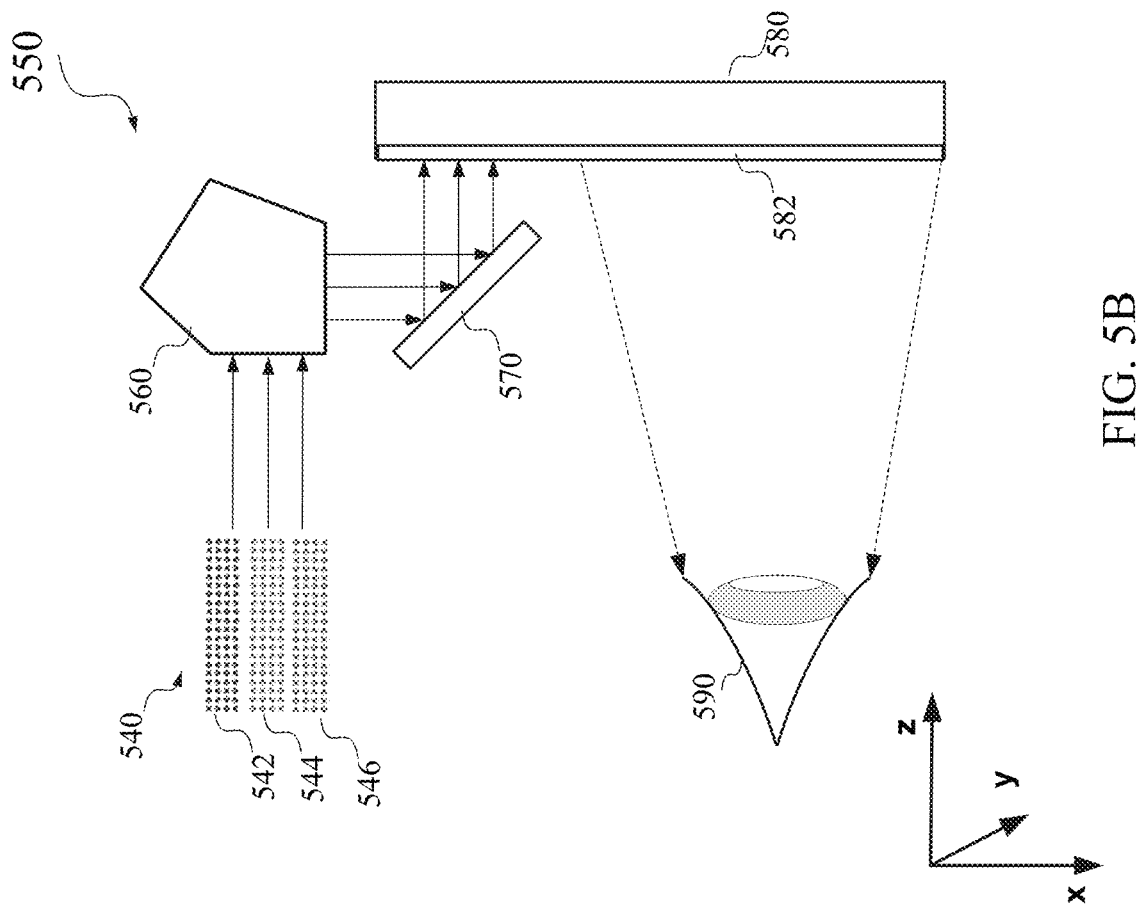
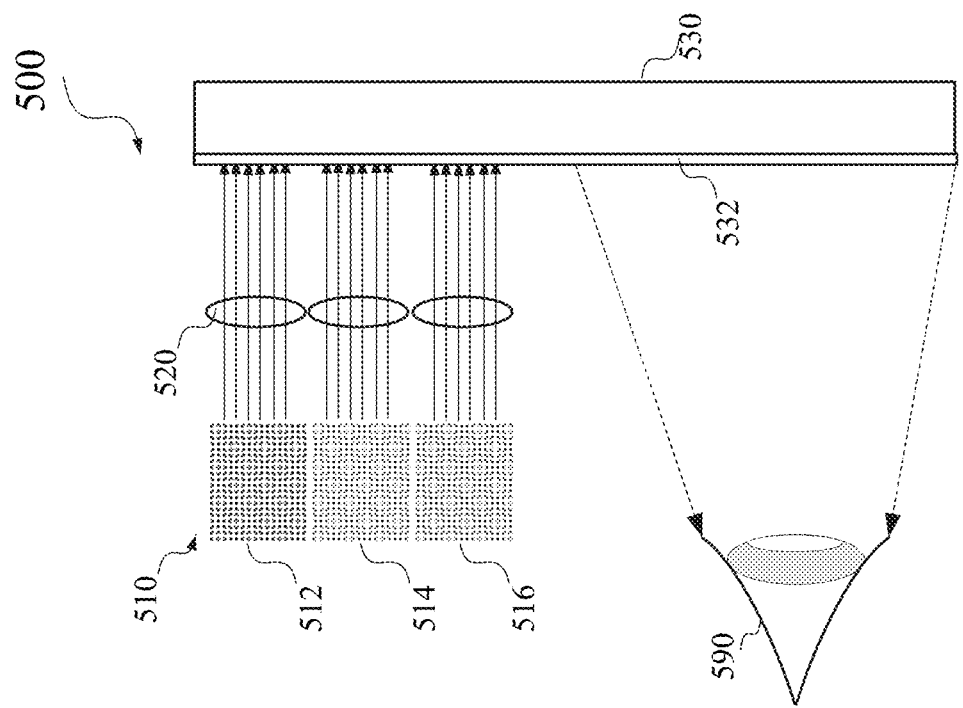
FIG. 5B
FIG. 5A

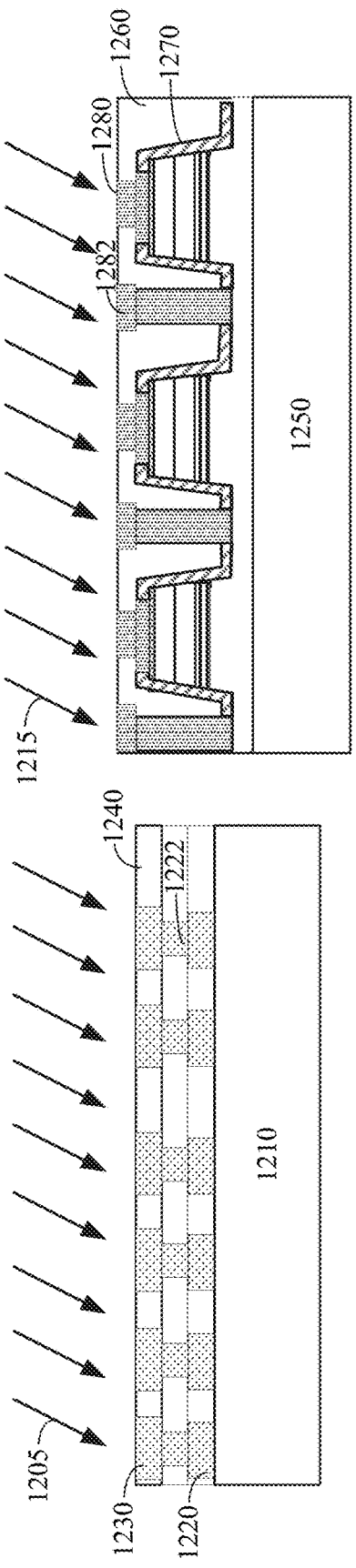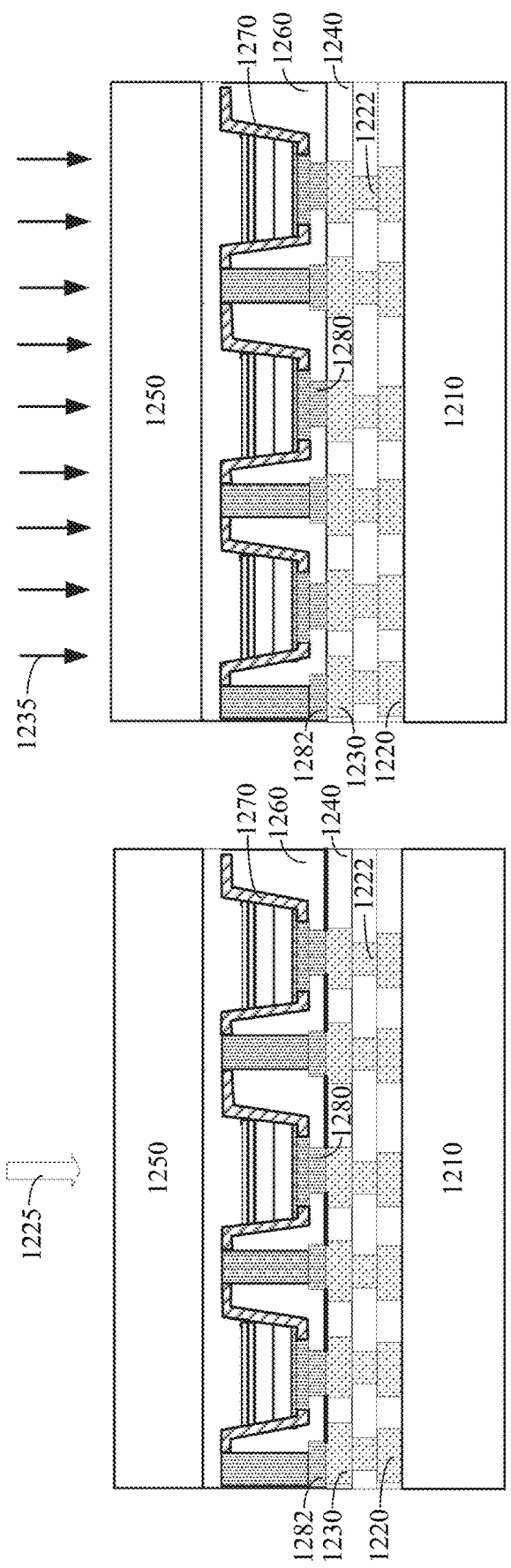
FIG. 12A
FIG. 12B
FIG. 12C
FIG. 12D

3-D STRUCTURE FOR INCREASING CONTACT SURFACE AREA FOR LEDS

RELATED APPLICATIONS

This application is a divisional of U.S. Non-Provisional application Ser. No. 16/810,457, filed Mar. 5, 2020, which claims the benefit and priority of U.S. Provisional Application No. 62/978,984, filed Feb. 20, 2020. The above-listed applications are assigned to the assignee hereof and incorporated herein in their entirety by reference.

BACKGROUND

Light-emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. As LEDs become ever smaller in size, the reduced physical dimensions of various features tend to decrease LED brightness. There is a need to improve the brightness of LEDs, especially at reduced physical dimensions.

SUMMARY

This disclosure relates generally to micro light-emitting diodes (micro-LEDs). More specifically, this disclosure relates to LEDs including a three dimensional (3-D) structure for increasing contact surface area. According to certain embodiments, an apparatus including a first three-dimensional (3-D) structure and a second 3-D structure may be provided. The first 3-D structure may include a first-type doped semiconductor material having semi-polar facets. The second 3-D structure may form a light-emitting diode (LED). The second 3-D structure may include a second-type doped semiconductor material, an active layer, and the first-type doped semiconductor material. The apparatus may also include a conductive layer which at least partially overlays and is in ohmic contact with the semi-polar facets of the first-type doped semiconductor material. In some embodiments, the conductive layer may be or include a metal and/or a transparent conducting oxide. The first-type doped semiconductor material of the first 3-D structure and the first-type doped semiconductor material of the second 3-D structure may be etched from a common first-type doped semiconductor epitaxial layer. In some embodiments, the first-type doped semiconductor material may include an N-type doped semiconductor material, and the second-type doped semiconductor material may include a P-type doped semiconductor material. For example, the N-type doped semiconductor material may be or include aluminum indium gallium phosphide (AlInGaP) or an III-Nitride material.

In some embodiments, the first 3-D structure and the second 3-D structure may have substantially similar mesa shapes. For example, each of the first 3-D structure and the second 3-D structure may have a parabolic shape. In other embodiments, the first 3-D structure and the second 3-D structure may have different shapes. For example, the first 3-D structure may have a rectangular plateau shape, and the second 3-D structure may have a parabolic shape. Optionally, the first 3-D structure and the second 3-D structure may have substantially similar heights.

In some embodiments, the conductive layer may at least partially overlay the first 3-D structure and may support an N-contact bump bond for the LED. A conductive layer may also at least partially overlay the second 3-D structure and may support a P-contact bump bond for the LED. The N-contact bump bond and the P-contact bump bond may have similar heights with respect to a substrate on which the first 3-D structure and the second 3-D structure are formed.

In some instances, the first 3-D structure may further include the second-type doped semiconductor material and an active layer. In such cases, the second-type doped semiconductor material of the first 3-D structure and the second-type doped semiconductor material of the second 3-D structure may be etched from a common second-type doped semiconductor epitaxial layer. Similarly, the active layer of the first 3-D structure and the active layer of the second 3-D structure may be etched from a common epitaxial layer. Optionally, the conductive layer may further overlay, at least partially, surfaces of the second-type doped semiconductor material and the active layer of the first 3-D structure.

In some embodiments, the first-type doped semiconductor material of the first 3-D structure may further include a C-plane facet. In such embodiments, the conductive layer may further overlay, at least partially, and may be in ohmic contact with, the C-plane facet of the first-type doped semiconductor material.

According to some embodiments, a method may be provided. The method may include obtaining a first three-dimensional (3-D) structure and a conductive layer. The first 3-D structure may include an N-type doped semiconductor material and may include a semi-polar facet of the N-type doped semiconductor material. The conductive layer may at least partially overlay and is in ohmic contact with the semi-polar facet of the N-type doped semiconductor material. The method may also include using the conductive layer as part of an N-type contact for a light-emitting diode (LED) formed as a second 3-D structure. The second 3-D structure may include a P-type doped semiconductor material, an active layer, and an N-type doped semiconductor material. The N-type doped semiconductor material of the first 3-D structure and the N-type doped semiconductor material of the second 3-D structure may be etched from a common N-type doped semiconductor epitaxial layer. In some embodiments, the first 3-D structure may have a substantially similar mesa shape as the second 3-D structure. For example, both the first 3-D structure and the second 3-D structure may have a domed shape. Optionally, the first 3-D structure may have a substantially similar height as the second 3-D structure.

A system for providing conductivity is also provided herein. According to certain embodiments, a system for providing conductivity may include a means for obtaining a first three-dimensional (3-D) structure and a conductive layer. The first 3-D structure may include an N-type doped semiconductor material and may include a semi-polar facet of the N-type doped semiconductor material. The conductive layer may at least partially overlay and may be in ohmic contact with the semi-polar facet of the N-type doped semiconductor material. The system may also include a means for using the conductive layer as part of an N-type contact for a light-emitting diode (LED) formed as a second 3-D structure. The second 3-D structure may include a P-type doped semiconductor material, an active layer, and an N-type doped semiconductor material. The N-type doped semiconductor material of the first 3-D structure and the N-type doped semiconductor material of the second 3-D structure may be etched from a common N-type doped semiconductor epitaxial layer.

This summary is neither intended to identify key or essential features of the claimed subject matter nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 12A-12D illustrates an example of a method of hybrid bonding for arrays of LEDs according to certain embodiments.

Figure 1:
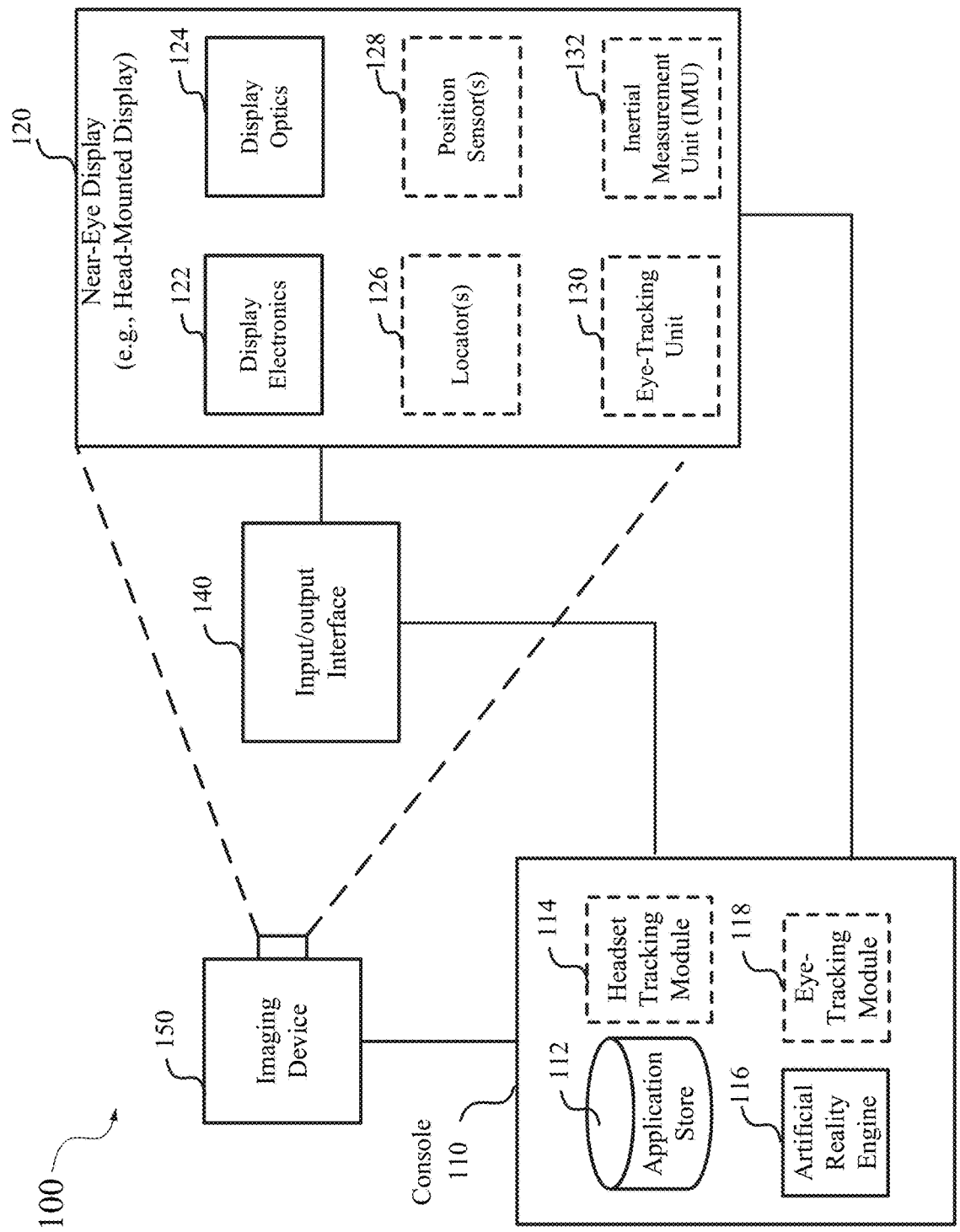
FIG. 1 illustrates a simplified diagram of an artificial reality system environment that may incorporate one or more embodiments as disclosed herein.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are techniques for improving the conductive characteristics of LED contacts to promote carrier flow. When a voltage is applied to an LED contact, a current may form, flowing between the LED electrodes. Here, "current" refers to conventional current. In other words, electrons flow in the opposite direction as current. When current is flowing between the electrodes, the electrons flow towards and recombine with holes in an active layer of the LED. From the recombination of electrons and holes, a photon (i.e., light) may be emitted from the LED. Thus, any restriction on the current corresponds to restriction on the flow of electrons recombining with holes. This may result a reduction of light emission from the LED.

Current may be affected by resistances within the LED system. One type of resistance is contact resistance. Contact resistance may refer to the resistivity of contacting surfaces of electrical leads and connections. For example, the interface between an N-type semiconductor material and a conductive layer may have a specific contact resistance which may affect current. Accordingly, reducing contact resistance at interfaces within the LED may provide for increased light emission.

Micro-LEDs ("µLEDs") based on III-nitride semiconductors, such as alloys of AlN, GaN, InN, and the like, have begun to be developed for various display applications due to their small size (e.g., with a linear dimension less than 100 µm, less than 50 µm, less than 10 µm, or less than 5 µm), high packing density (and hence higher resolution), and high brightness. The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "light emitting diode (LED)" refers to a light source that includes at least an N-type semiconductor layer, a P-type semiconductor layer, and a light emitting region (i.e., active region) between the N-type semiconductor layer and the P-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs) each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3-D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
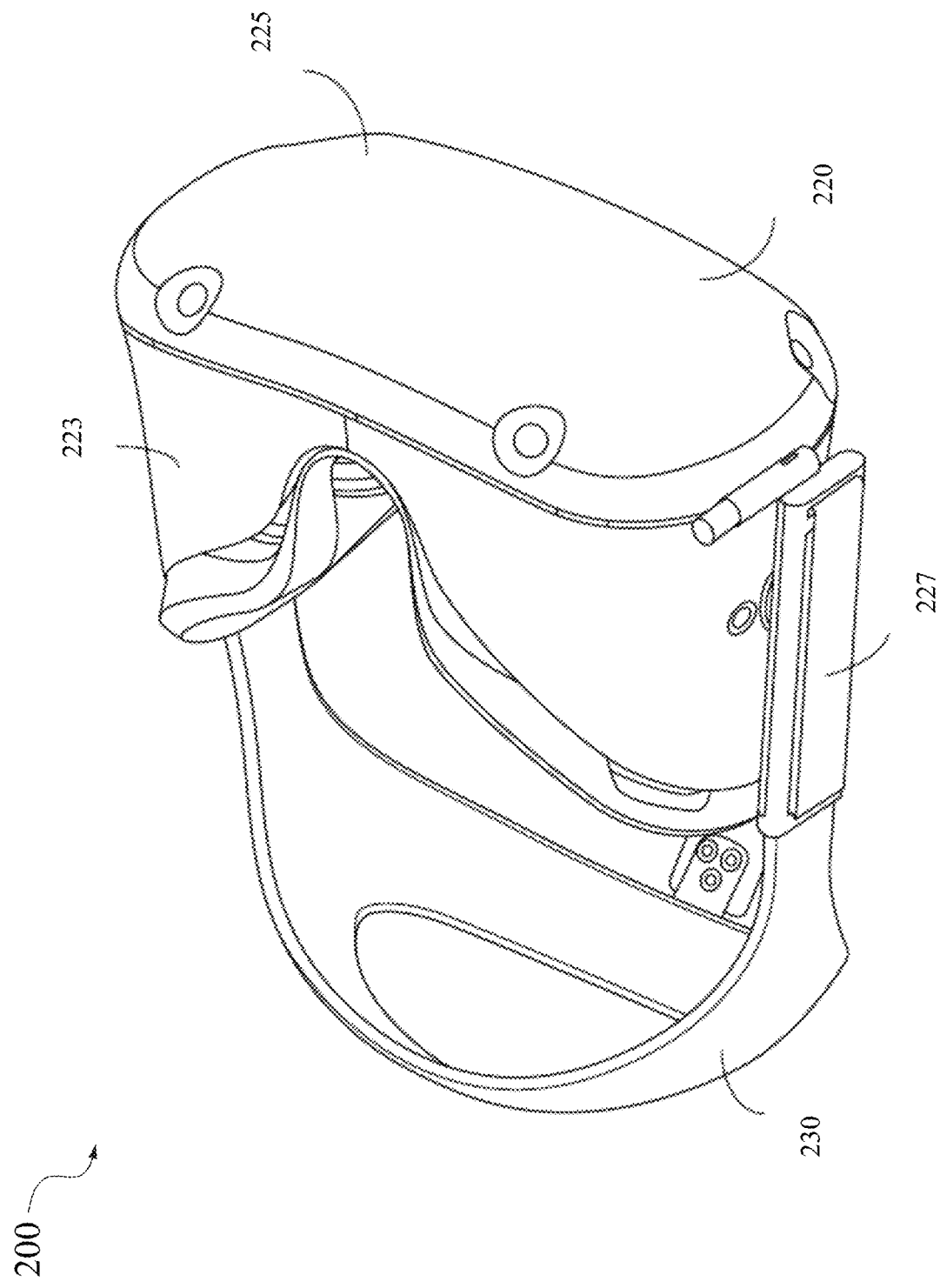
FIG. 2 illustrates a perspective view of an example of a near-eye display for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3-D) images), videos (e.g., 2D or 3-D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
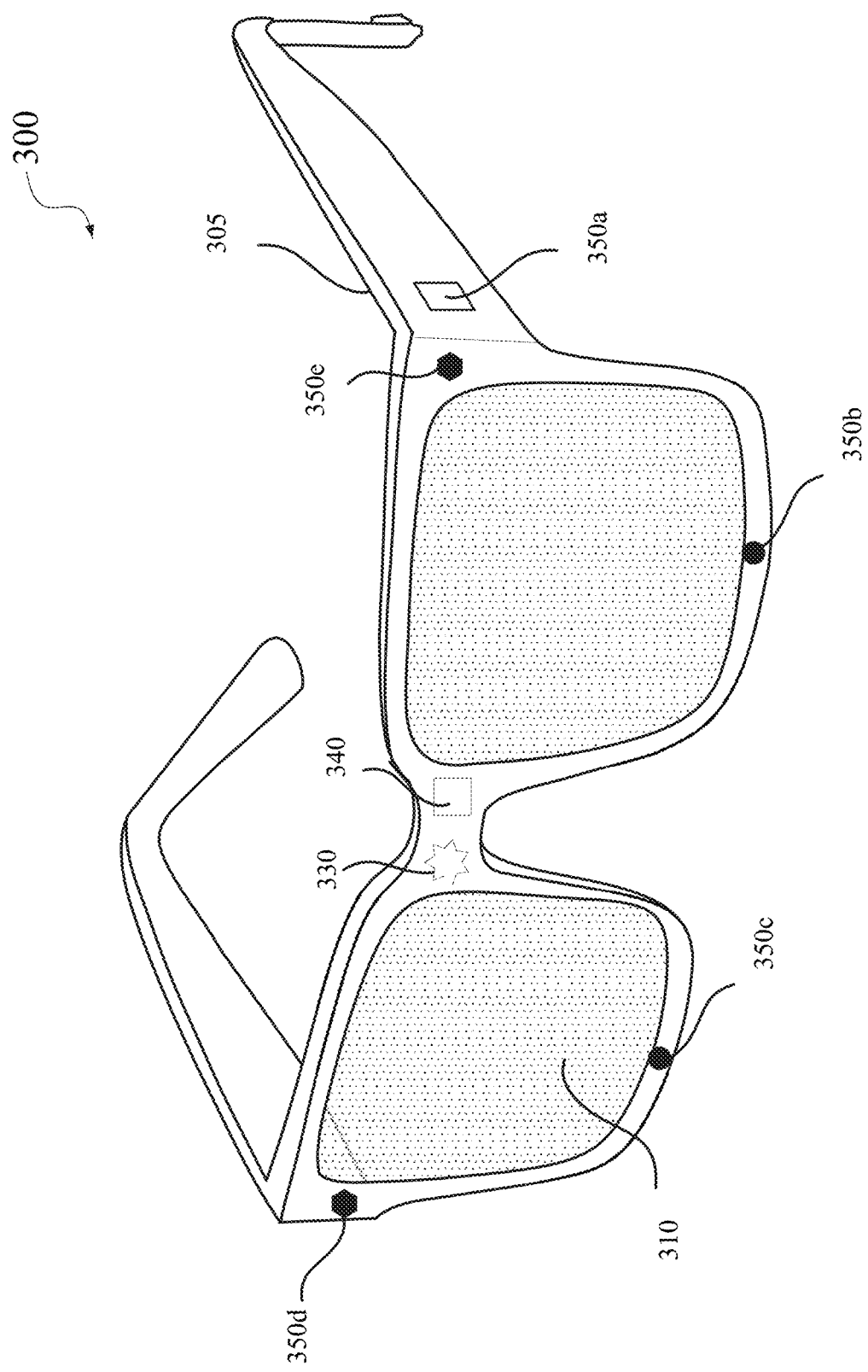
FIG. 3 illustrates a perspective view of an example of a near-eye display for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
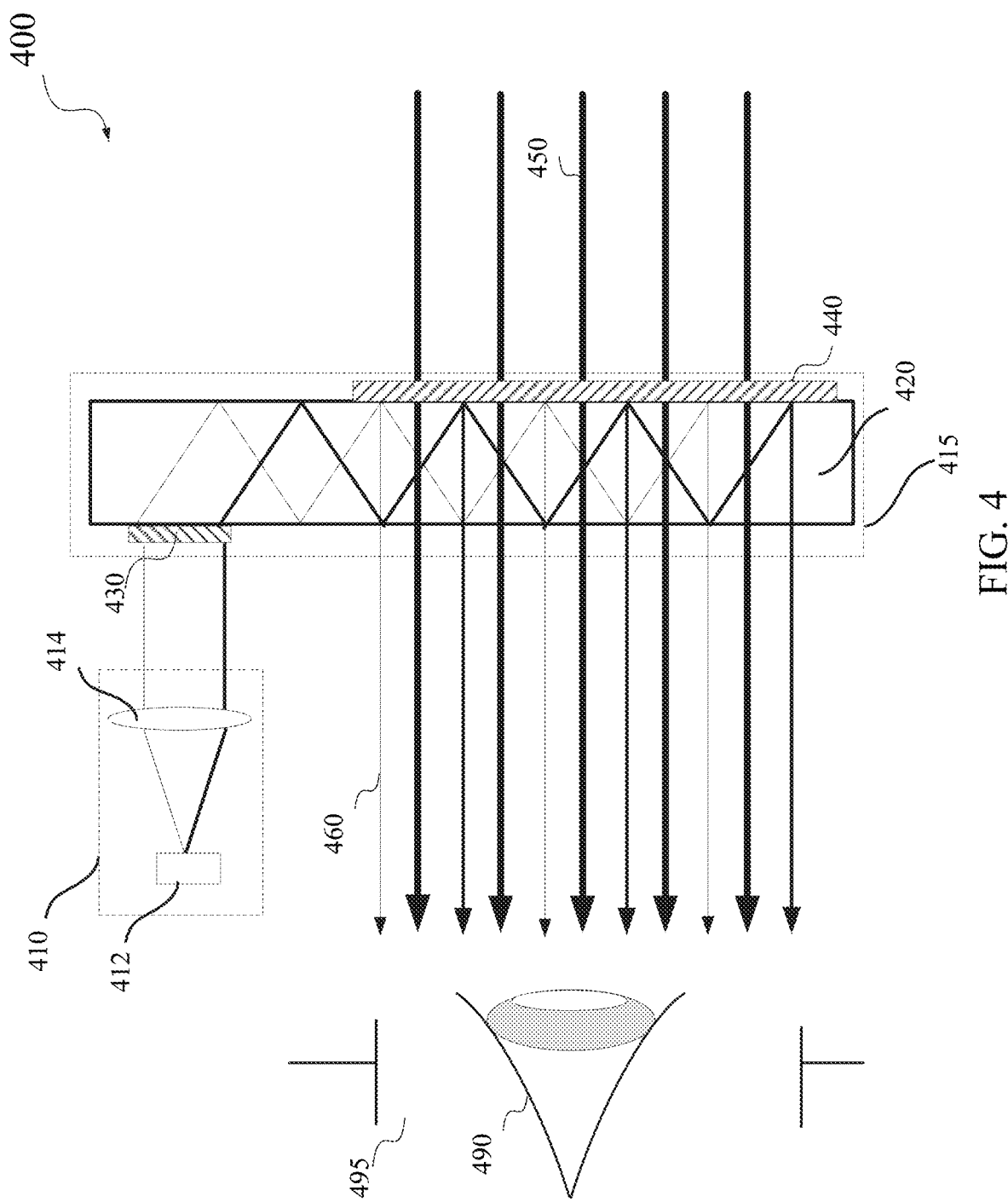
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above) each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440 each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or a transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facets prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different areas of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
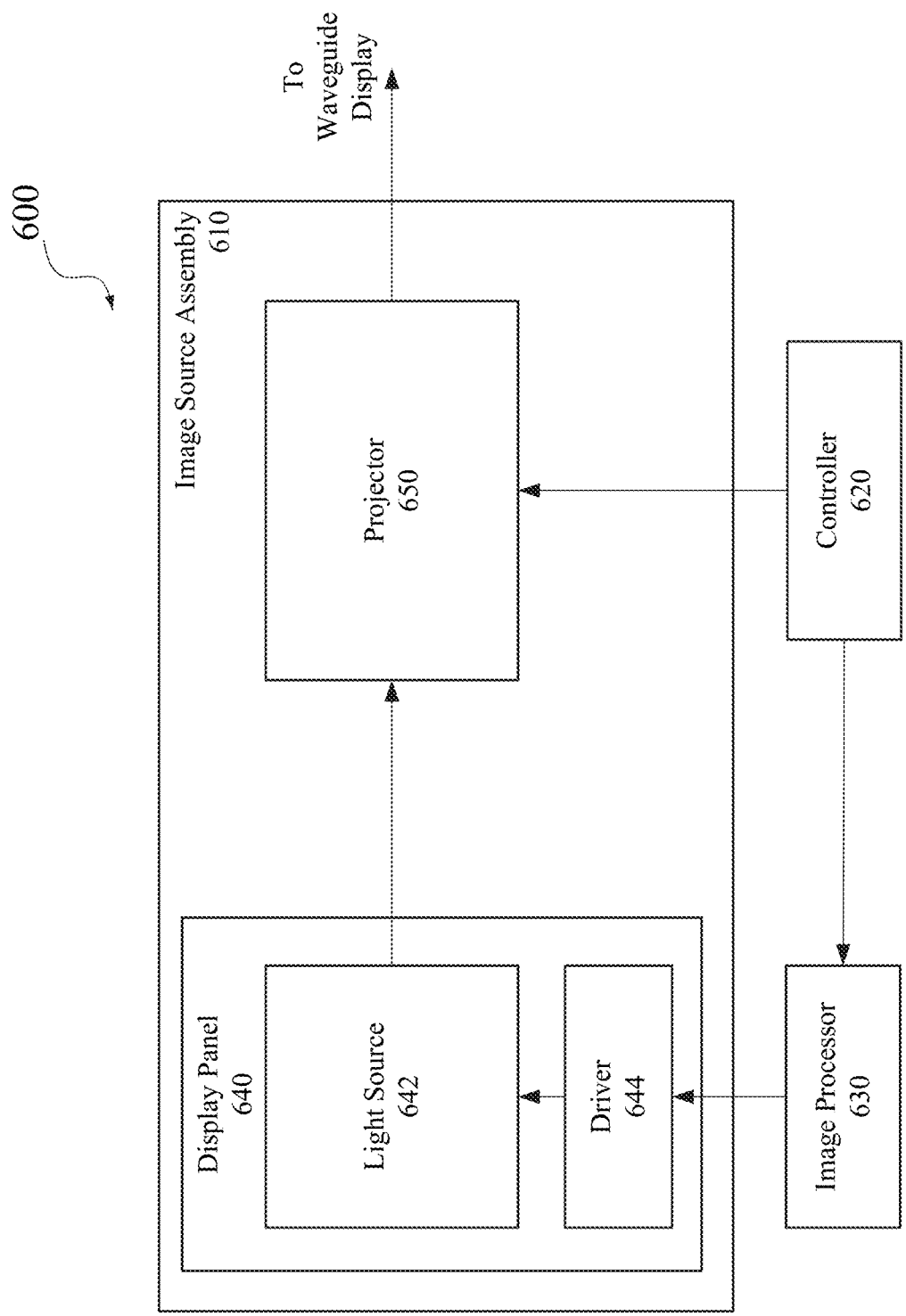
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an N-type material layer, an active region that may include hetero-structures (e.g., one or more quantum wells), and a P-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

The light sources or displays described above may include one or more light emitting diodes (LEDs). For example, each pixel in a display may include three subpixels that include a red micro-LED, a green micro-LED, and a blue micro-LED. In some embodiments, an infra-red micro-LED may also be included, for a total for four subpixels. A semiconductor light emitting diode generally includes an active light emitting layer within multiple layers of semiconductor materials. The multiple layers of semiconductor materials may include different compound materials or a same base material with different dopants and/or different doping densities. For example, the multiple layers of semiconductor materials may include an N-type material layer, an active layer that may include hetero-structures (e.g., one or more quantum wells), and a P-type material layer. The multiple layers of semiconductor materials may be grown on a surface of a substrate having a certain orientation. In some embodiments, to increase light extraction efficiency, a mesa that includes at least some of the layers of semiconductor materials may be formed.

Figure 7:
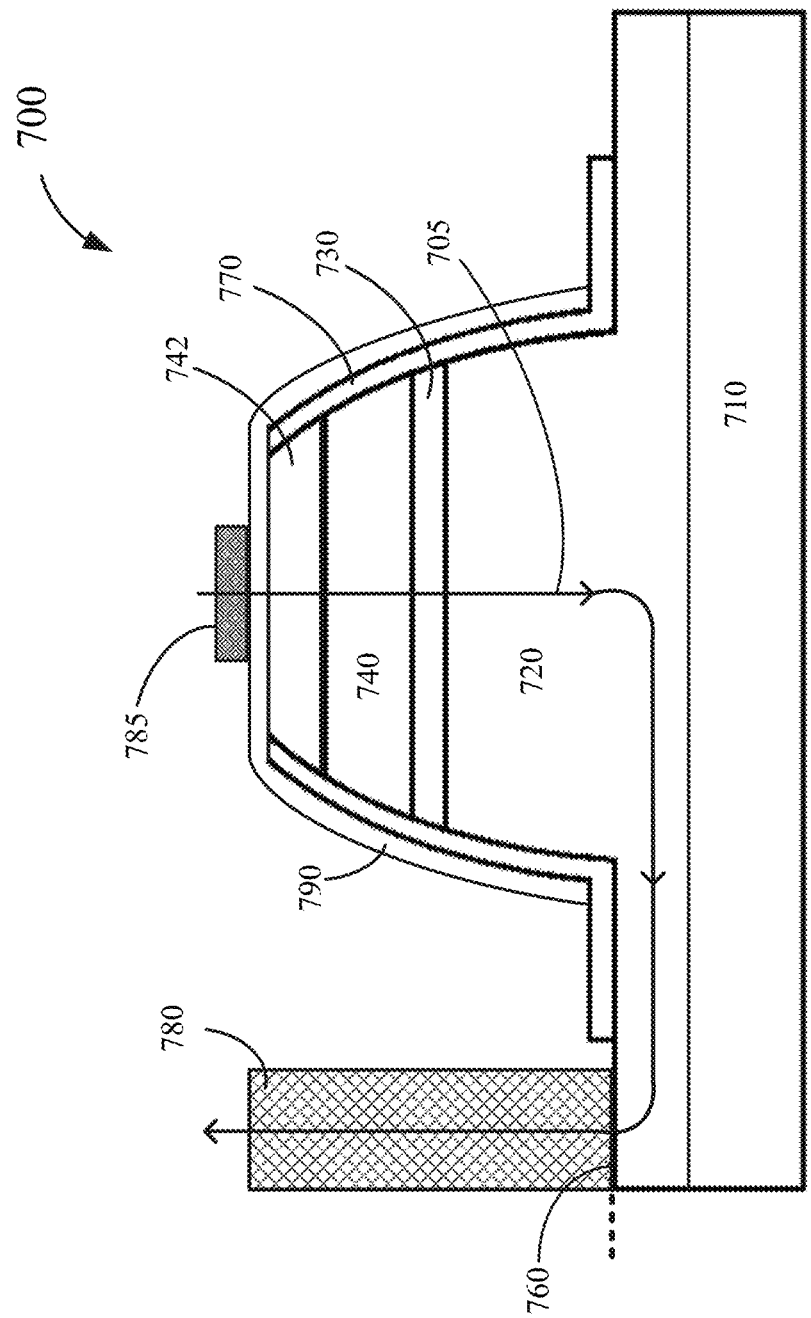
FIG. 7 illustrates an example LED including a parabolic mesa shape.

FIG. 7 is a cross-sectional view of an example of an LED 700 having a parabolic mesa shape. According to embodiments of the disclosure, LED 700 may emit incoherent light. LED 700 may be a micro-LED having a lateral dimension, or diameter, of less than 10 micrometer. LED 700 may be made of inorganic materials, such as multiple layers of semiconductor materials. For example, the layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

The layered semiconductor device may be manufactured by growing multiple epitaxial layers on a substrate, in one or more chambers, using techniques such as molecular beam epitaxy (MBE), metalorganic vapor-phase epitaxy (MOVPE), also known as organometallic vapor-phase epitaxy (OMVPE) or metalorganic chemical vapor deposition (MOCVD), or physical vapor deposition (PVD), such as pulsed laser deposition (PLD). For example, the semiconductor layers may be grown layer-by-layer on a substrate with a certain crystal lattice orientation, such as a sapphire, quartz, gallium nitride (GaN), gallium arsenide (GaAs), gallium phosphide (GaP). The silicon substrate may be cut in a specific direction to expose a specific plane as the growth surface.

In the example shown in FIG. 7, LED 700 may include a substrate 710, which may include, for example, an aluminum oxide (Al$_2$O$_3$) substrate ("sapphire" substrate) or a GaN substrate. A semiconductor layer 720 may be grown on substrate 710. Semiconductor layer 720 may include a Group III-V material, such as GaN, and may be p-doped (e.g., with Mg, Ca, Zn, or Be) or n-doped (e.g., with Si or Ge). In the example shown in FIG. 7, semiconductor layer 720 may be an N-type doped semiconductor material. One or more active layers 730 may be grown on semiconductor layer 720. Active layers 730 may include may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layers 730. Semiconductor layer 740 include a III-V material, such as GaN, and may be p-doped (e.g., with Mg, Ca, Zn, or Be) or n-doped (e.g., with Si or Ge). One of semiconductor layer 720 and semiconductor layer 740 may be a P-type layer and the other one may be an N-type layer. Semiconductor layer 720 and semiconductor layer 740 sandwich active layer 730 to form the light emitting region. For example, LED 700 may include a layer of InGaN situated between a layer of P-type GaN doped with magnesium and a layer of N-type GaN doped with silicon or oxygen. In some embodiments, LED 700 may include a layer of AlInGaP situated between a layer of P-type AlInGaP doped with zinc or magnesium and a layer of N-type AlInGaP doped with selenium, silicon, or tellurium.

In some embodiments, an electron-blocking layer (EBL) (not shown in FIG. 7) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 742, such as a P$^+$ or P$^{++}$ semiconductor layer, may be formed on semiconductor layer 740 and act as a contact layer for forming an ohmic contact and reducing the contact impedance of the device. In some embodiments, a conductive layer 790 may be formed on heavily-doped semiconductor layer 742. In embodiments that do not include heavily-doped semiconductor layer 742, conductive layer 790 may be formed on semiconductor layer 740. Conductive layer 790 may include, for example, an indium tin oxide (ITO) or Al/Ni/Au film. In one example, conductive layer 790 may include a transparent ITO layer.

To make contact with semiconductor layer 720 (e.g., an n-GaN layer) of the diode and to extract light emitted by active layers 730 from LED 700, the semiconductor layers (including heavily-doped semiconductor layer 742, if present, semiconductor layer 740, active layer 730, and semiconductor layer 720) may be etched to expose semiconductor layer 720 and form a mesa shape that includes layers 720-740. The mesa shape may confine the carriers within the device. Etching the mesa shape may lead to the formation of mesa side walls that may be non-parallel with, or in some cases, orthogonal to the growth planes. A passivation layer 770 may be formed on the sidewalls of the mesa shape.

Passivation layer 770 may include an oxide layer, such as a SiO2 layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 785, such as an Al/Ni/Au metal layer, may be formed on conductive layer 790 and may act as another electrode of LED 700.

Etching of the mesa shape may lead to formation of one or more facets. A facet may refer to the plane of a surface relative to the crystalline growth plane of the semiconductor material. For example, as illustrated in FIG. 7, a C-plane facet 760 may be parallel to the crystalline growth of semiconductor layer 720. As used herein, facet may also refer to the surface between two adjacent materials through which current may flow when the LED is activated. For example, C-plane facet 760 may be formed along the contact surface area between semiconductor layer 720 and a contact layer 780. As indicated by current 705, when LED 700 is activated (i.e., a required voltage applied), then current 705 may flow from contact layer 785 to contact layer 780 via C-plane facet 760.

In some embodiments, contact layer 780 may be or include a n-contact bump bond while contact layer 785 may be formed to make ohmic contact with semiconductor layer 740 to act as another electrode of LED 700. As depicted in FIG. 7, contact layer 785 may be a P-contact. In some embodiments, an additional layer of conductive layer 790 may be included as an intermediate conductive layer between the contact layer 785 and semiconductor layer 740. In some embodiments, contact layer 780 and contact layer 785 may be at different heights, with respect to substrate 710.

When a voltage signal is applied to contact layers 780 and 785, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 790 and contact layer 785) or bottom (e.g., substrate 710).

When the voltage signal is applied across contact layers 780 and 785, current 705 may flow through C-plane facet 760. Because current flows in the opposite direction as electron flow, current 705 may flow from contact layer 785 to contact layer 780 through semiconductor layer 720. The contact surface between semiconductor layer 720 and contact 780 may be C-plane facet 760. Depending on the material system used for contact layer 780, semiconductor layer 720, and an additional conductive layer, if used (not shown), between contact layer 780 and semiconductor layer 720, C-plane facet 760 may have a contact resistance. As used herein, the term contact resistance may refer to the contribution to the total resistance of a system which can be attributed to the contacting interfaces of electrical leads and connections as opposed to the intrinsic resistance, which is an inherent property, independent of the measurement method. In some embodiments, C-plane facet 760 may modify current 705 as it travels from contact layer 785 to contact layer 780 due to the contact resistance of C-plane facet 760. For example, C-plane facet 760 may decrease current 705 or increase current 705 as it travels through C-plane facet 760. Additionally, C-plane facet 760 may modify (i.e., reduce) current 705 as it travels through it due to the limited surface area of C-plane facet 760.

In some embodiments, the LED 700 may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

In some embodiments, the mesa shape may form one or more additional facets through which current may flow when a voltage is applied to the contact layers. As provided herein, the sidewalls of a mesa shape may be utilized to increase the surface area through which current may flow between a second-type doped semiconductor material, such as semiconductor layer 720, and a contact layer, such as contact layer 780. By increasing the surface area through which current may flow, the overall resistance applied to the current may be reduced. In some cases, the greater the current through an LED, the stronger the light emission from the active layers may be.

Figure 8:
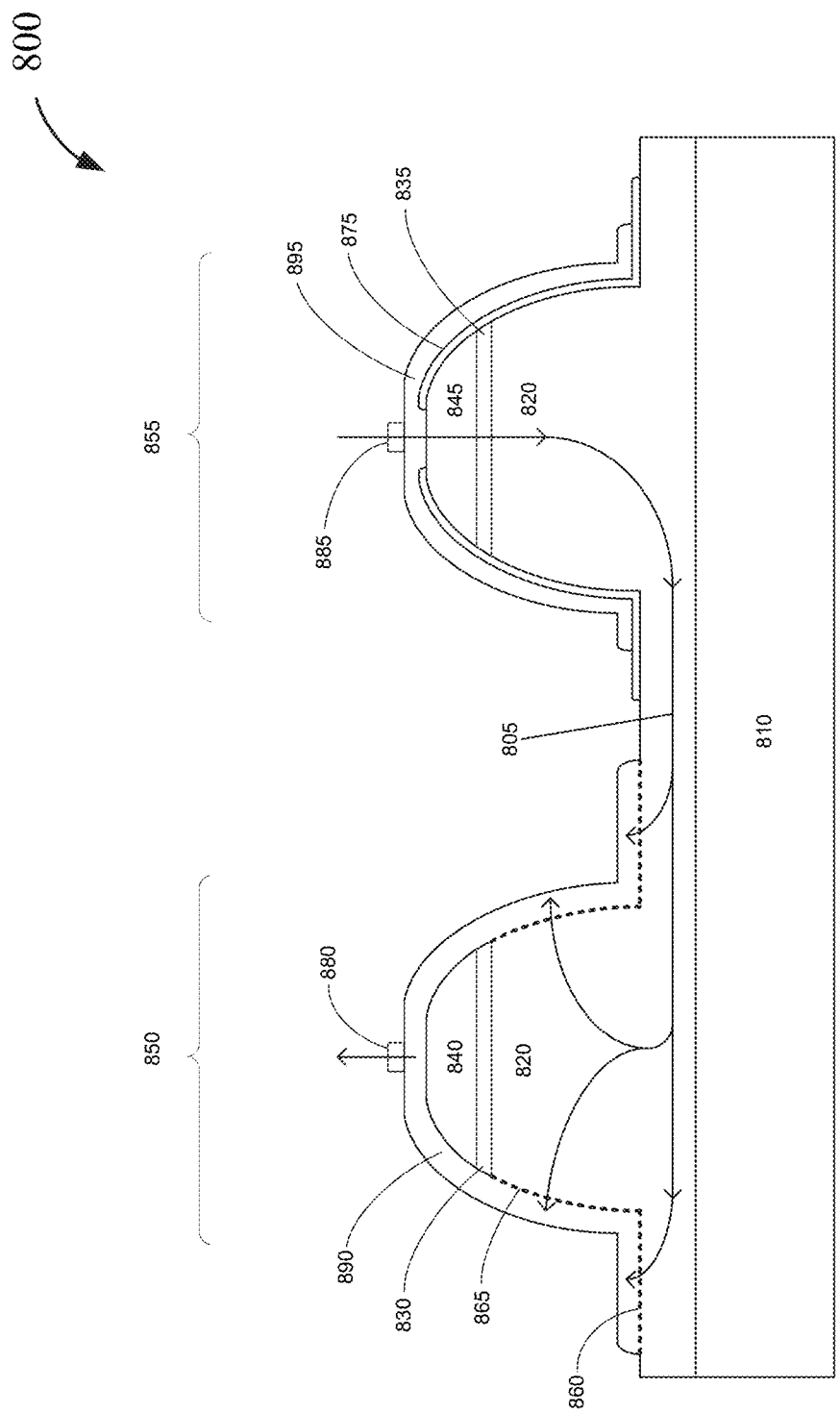
FIG. 8 illustrates an example LED in which one or more embodiments may be implemented.

FIG. 8 illustrates an example of an LED 800 including mesa shapes which may provide for increased surface area for current flow between contact layers. As depicted, LED 800 may include a structure 850 and a structure 855. Structure 850 may be a first three-dimensional (3-D) structure and structure 855 may be a second 3-D structure. In some embodiments, such as the embodiment depicted in FIG. 8, structure 850 may be a non-light emitting mesa structure and structure 855 may be a light emitting mesa structure. As used herein, a light emitting mesa structure may refer to the mesa shape in which the active layers are activated, and thus emit light, when a voltage is applied to LED 800. In contrast, a non-light emitting mesa structure may refer to the mesa shape in which the active layers are not activated, and thus no light is emitted, when a voltage is applied to LED 800.

As shown, structure 850 may comprises a semiconductor layer 820, one or more active layers 830, a semiconductor layer 840, a contact layer 880, and a conductive layer 890. Structure 855 may comprise the semiconductor layer 820, one or more active layers 835, a semiconductor layer 845, a passivation layer 875, a contact layer 885, and a conductive layer 895. In certain embodiments, structure 850 and structure 855 are formed from layers of the same epitaxial formation. As shown, semiconductor layer 820 is shared across structure 850 and structure 850. The one or more active layers 830 and one or more active layers 835 may have been originally grown as one or more common layers. Similarly, semiconductor layer 840 and semiconductor layer 845 may have been grown as a common semiconductor layer. Such common layers of the epitaxial formation may be etched to form the separate mesa structures 850 and 855. Additional layers such conductive layers 890 and 595, as well as contact layers 880 and 885, may be deposited or otherwise formed on the respective structures 850 and 855.

Structure 850, as a non-light emitting mesa, may serve as the N-contact for the light emitting mesa structure 855. In some embodiments, structure 850 may serve to replace contact layer 780 as described with reference to FIG. 7. Current 805 flows through structure 855, the light emitting structure, in a similar manner as described previously with respect to LED 700 in FIG. 7. That is, current 805 flows through the one or more active layers 835, resulting in recombination of electrons and holes within the one or more active layers 835 and emission of photons. Structure 850 thus generates light as a light emitting mesa structure. Current 805 flows through structure 855, the non-light emitting mesa structure, in a very different way. Current 805 bypasses the one or more active layers 830. Instead, current 805 flows through and exits semiconductor layer 820 at various locations such as a C-plane facet 860 and semi-polar facets 865 of the semiconductor layer 820. From there, current travels to conductive layer 890, through conductive layer 890, then to contact layer 880 and out of structure 850. Such a path bypasses the one or more active layers 830 (as well as semiconductor layer 840), and little or no recombination of electrons and holes occurs at the one or more active layers 830. In this manner, structure 850 may function as non-light emitting mesa structure that serves as the N-contact for structure 855, the light emitting mesa structure.

The mesa shape of structure 850 may impact the overall resistance of LED 800. As noted above, etching the mesa shapes may lead to the formation of facets which are non-parallel with the crystalline growth of layers 820-845. The example of FIG. 8 illustrates two different types of facets that may be formed by structure 850. Structure 850 may include a C-plane facet 860, which may be similar to C-plane facet 760, and semi-polar facets 865. Because the term "facet" refers to the plane of the surface relative to the crystalline growth plane of layers 820-845, semi-polar facets 865 formed by a domed mesa shape may have an infinite number of facets with planes at different angles. For example, the surface of the sidewalls of semiconductor layer 820, exposed during etching of structure 855, may form semi-polar facets 865. Semi-polar facets 865 may include varying cross-sectional cuts of the crystalline lattice of semiconductor layer 820. Each cross-sectional cut, or angle, through the crystalline lattice of semiconductor layer 820 may have a corresponding contact resistance (i.e., as measured per square cm resistance) when a current, such as current 805, travels through the surface of semiconductor layer 820 to a corresponding material. Said another way, each facet within semi-polar facets 865 may have a different specific contact resistivity, in part due to the crystallographic plane etched during etching of semiconductor layer 820. Here, when a voltage is applied to LED 800, current 805 may flow from semiconductor layer 820, through semi-polar facets 865, to conductive layer 890.

Semi-polar facets 865 may have a different overall resistivity than C-plane facet 860. Because C-plane facet 860 is etched in a singular plane, thereby forming a singular facet, of semiconductor layer 820, the overall resistivity of C-plane facet 860 may correspond to the specific contact resistivity of that single plane. In contrast, the overall resistivity of semi-polar facets 865 may correspond to all the planes of semiconductor layer 820 that are formed. Thus, the overall resistivity of semi-polar facets 865 may be the sum of the specific contact resistivity for each plane or facet within semi-polar facets 865. The variation in contact resistivity throughout all of the planes (i.e., facets) within semi-polar facets 865 may result in differing degrees of "semi-polarity" depending on the angle at which semiconductor layer 820 is etched. In some embodiments, the overall resistivity of semi-polar facets 865 may be quantified as a mean, medium, average, or a sum of the specific contact resistances.

In some embodiments, semi-polar facets 865 may have a lower overall resistivity than C-plane facet 860. In other embodiments, semi-polar facets 865 may have higher overall resistivity than C-plane facet 860. Even in such embodiments, the use of semi-polar facets 865 as additional contact surfaces lowers the overall resistance of structure 850 in its role as an N contact for the LED formed by structure 855. A lower overall resistivity may be advantageous because it may correspond to increased light (i.e., photon) emission from the one or more active layers 835. The specific contact resistivity of an etched plane may vary depending on the material system, in part due to the growth morphology of the material's crystalline structure. As such, a material for semiconductor layer 820 may be selected to optimize (i.e., minimize) the overall resistance of semi-polar facets 865 and/or C-plane facet 860 for current 805 flowing through LED 800, taking into account factors such as other performance characteristics of materials, availability, cost, etc. For example, a first material for semiconductor layer 820 may reduce resistivity for current 805 transferring through semi-polar facets 865, but may increase resistivity for current 805 transferring through C-plane 860. In other embodiments, a second material for semiconductor layer 820 may have the opposite effect.

Semi-polar facets 865 may reduce the overall resistance for current 805 flowing through LED 800 by utilizing a portion of the sidewalls of structure 850 as the additional surface area through which current 805 may flow. The mesa shapes of structure 855 may expose semiconductor layer 820 along the mesa sidewalls. The exposed surface area of semiconductor layer 820 along the mesa sidewalls may provide additional surface area as compared with other types of LEDs which may include only the surface area of a C-plane facet, such as C-plane facet 860, for ohmic contact. Increasing the surface area through which current 805 may flow may also act to reduce the overall resistance for current 805 flowing from contact layer 885 to contact layer 880. In some embodiments, the increased surface area and lower resistivity of semi-polar facets 865 may cause LED 800 to have a lower overall resistance, and therefore higher overall current, than other LEDs that utilize facets which do not include semi-polar facets 865 (i.e., C-plane or R-plane facets). For example, LED 800 may have a lower overall resistance than LED 700. In some embodiments, the overall resistance as described herein may correspond to the overall resistance of the N-type contact, such as the overall resistance of structure 850, which may form an N-type contact for LED 800.

In some embodiments, structure 850 and structure 855 may have the same or substantially similar mesa shapes. In some cases, the mesa shape of structure 850 and the mesa shape of structure 855 may vary only due to processing differences and may be designed and prepared as having substantially similar mesa shapes. For example, structure 850 may have a similar overall shape as structure 855, such as both structures 850 and 855 having a domed mesa shape. In other embodiments, however, structure 850 may have a different mesa shape as structure 855. For example, structure 850 may have a rectangular plateau mesa shape and structure 855 may have a domed mesa shape. It may be advantageous to form structure 850 to be substantially similar to structure 855 because this may allow for more cost-effective manufacturing and higher productivity. Given the complications of manufacturing processes (e.g., lithography, etc.), it may be more efficient and cost-effective to form substantially similar or the same mesa shape, repeated structures, such as structures 850 and 855. The formation of structure 850 as a non-light emitting mesa shape may be done simply so that the top of both structures 850 and structure 855 are at the same height.

In some embodiments, structure 850 may have a substantially similar height as structure 855. For example, the height of structure 850 may be within from about 0.1 nm to about 10 nm of the height of structure 855. The height of structure 850 and structure 855 may be substantially similar in that there may be less than 1% variation between the height of structure 850 and the height of structure 855. For example, the heights of structure 850 and structure 855 may be within +/−1% of one another.

The substantially similar heights of structure 850 and structure 855 may allow for the height of contact layer 880 and contact layer 885 to be substantially similar as well. By forming contact layer 880 and contact layer 885 to have substantially similar heights, bonding both contact layer 880 and contact layer 885 to a common backplane or driver chip may be facilitated. For example, when N-type contact layer 880 and contact layer 885 have substantially similar heights, bonding them to a common backplane may require less time, manufacturing (i.e., bending backplane and/or placing an intermediate component), and/or skill than when N-type contact layer 880 and contact layer 885 have different heights.

In some embodiments, contact layer 880 may be similar to contact layer 780 in material and composition, and may comprise a metal, such as Al, Au, Ni, Ti, or any combination thereof, or non-metal conductive material. Contact layer 880 may be formed on structure 850. In some embodiments, contact layer 880 may be formed on a conductive layer 890 which at least partially overlays structure 850. Conductive layer 890 may be similar to conductive layer 790 in material and function. Contact layer 880 may act as an electrode of LED 800. As illustrated in FIG. 8, contact layer 880 may be an N-contact bump bond. Another contact layer 885, which may include an Al/Ni/Au metal layer, may be formed on structure 855 to make ohmic contact with semiconductor layer 840 to act as another electrode of LED 800. In some embodiments, contact layer 885 may be similar to contact layer 785 in material and function. As illustrated in FIG. 8, contact layer 885 may be formed on a conductive layer 895. Conductive layer 895 may be similar to conductive layer 890 and/or conductive layer 790 in material and function. Optionally, conductive layer 895 may be or include a reflective layer. A reflective layer as part of conductive layer 895 may act as a reflector to reflect emitted light out of structure 855. In some embodiments, contact layer 885 may be a p-contact bump bond, such as the example depicted in FIG. 8.

Structure 850 may include conductive layer 890, and structure 855 may include conductive layer 895. Conductive layer 890 may at least partially overlay structure 850 and maybe in ohmic contact with semi-polar facets 865 on the surface of semiconductor layer 820. In some embodiments, conductive layer 890 may be deposited over the entirety of the mesa sidewalls of structure 850. In some embodiments, conductive layer 890 may extend onto semiconductor layer 820 around the perimeter of structure 850. Similarly, conductive layer 895 may be deposited over the entirety of structure 855 and be in ohmic contact with semiconductor layer 845. Optionally, conductive layer 895 may extend about a portion of the perimeter of structure 855.

Conductive layer 890 may be included in structure 850 as an intermediate conductive layer between contact layer 880 and semiconductor layer 820. By contrast, conductive layer 895 may be included in structure 855 as an intermediate conductive layer between contact layer 885 and semiconductor layer 845.

In some embodiments, a passivation layer 875 may be formed on the sidewalls of structure 855. In some embodiments, passivation layer 875 may be similar to passivation layer 770 in material and function.

In some embodiments, an optional insulation layer (not shown) may be formed on top of the semiconductor layer 840 and active layers 830 along the sidewalls of structure 850. The optional insulation layer may insulate the semiconductor layer 840 and active layers 830, further ensuring that current 805 bypasses semiconductor layer 840 and active layers 830 when transferring from semiconductor layer 820 to conductive layer 890. The insulation layer may not cover the adjacent portion of semiconductor layer 820, thus leaving the semi-polar facets 865 of structure 850 exposed. Even without an insulation layer, current 805 may bypass semiconductor layer 840 and active layers 830 because, as noted above, the path through semi-polar facets 865 and/or C-plane facet 860 between semiconductor layer 820 and conductive layer 890 may form a path of least resistance.

According to embodiments of the disclosure, LED 800 may be a micro-LED having a lateral dimension, or diameter, of less than 10 micrometer. In some embodiments, the epitaxial layers of LED 800 may be similar to the epitaxial layers of LED 700 in material and function.

Figure 9A:
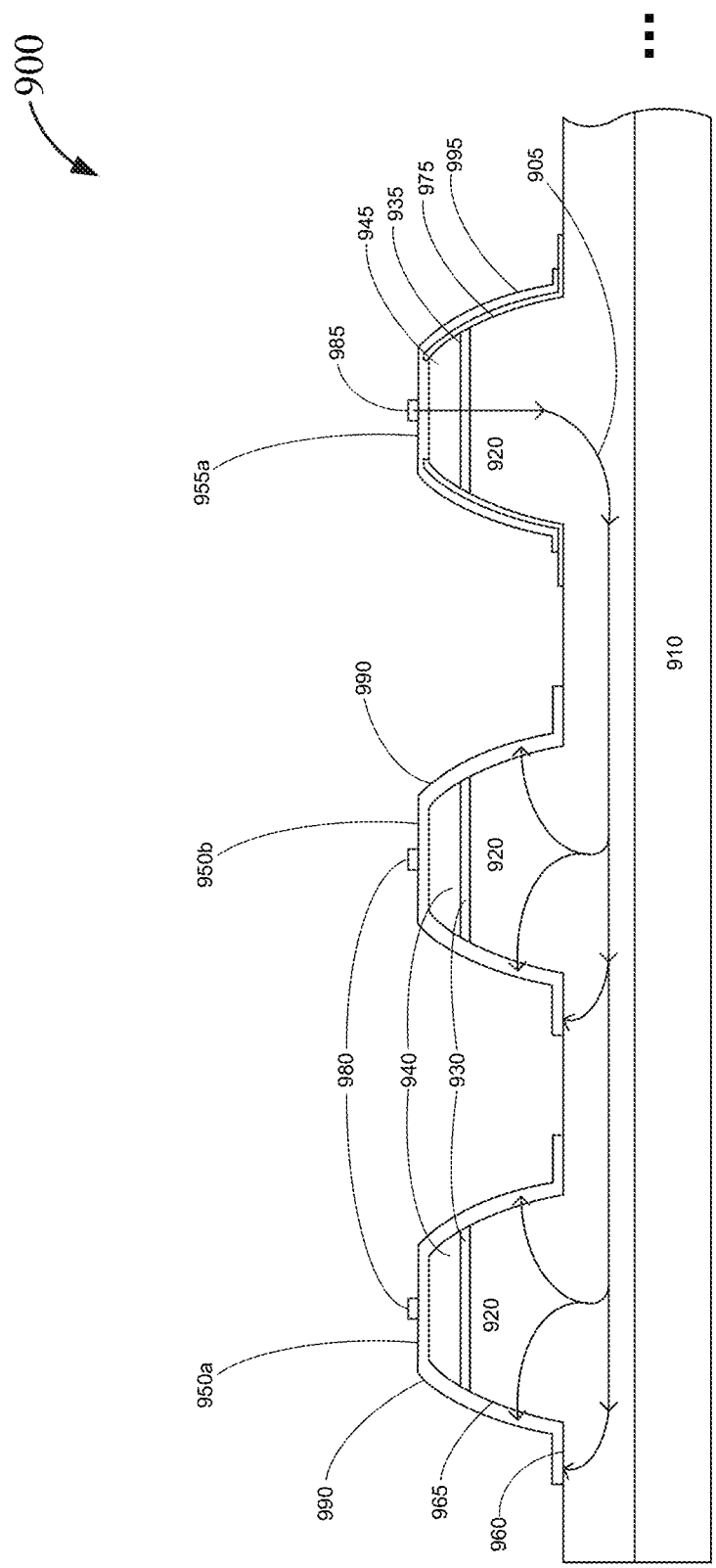
FIG. 9A illustrates a cross-sectional view of an example LED in which one or more embodiments may be implemented.
Figure 9B:
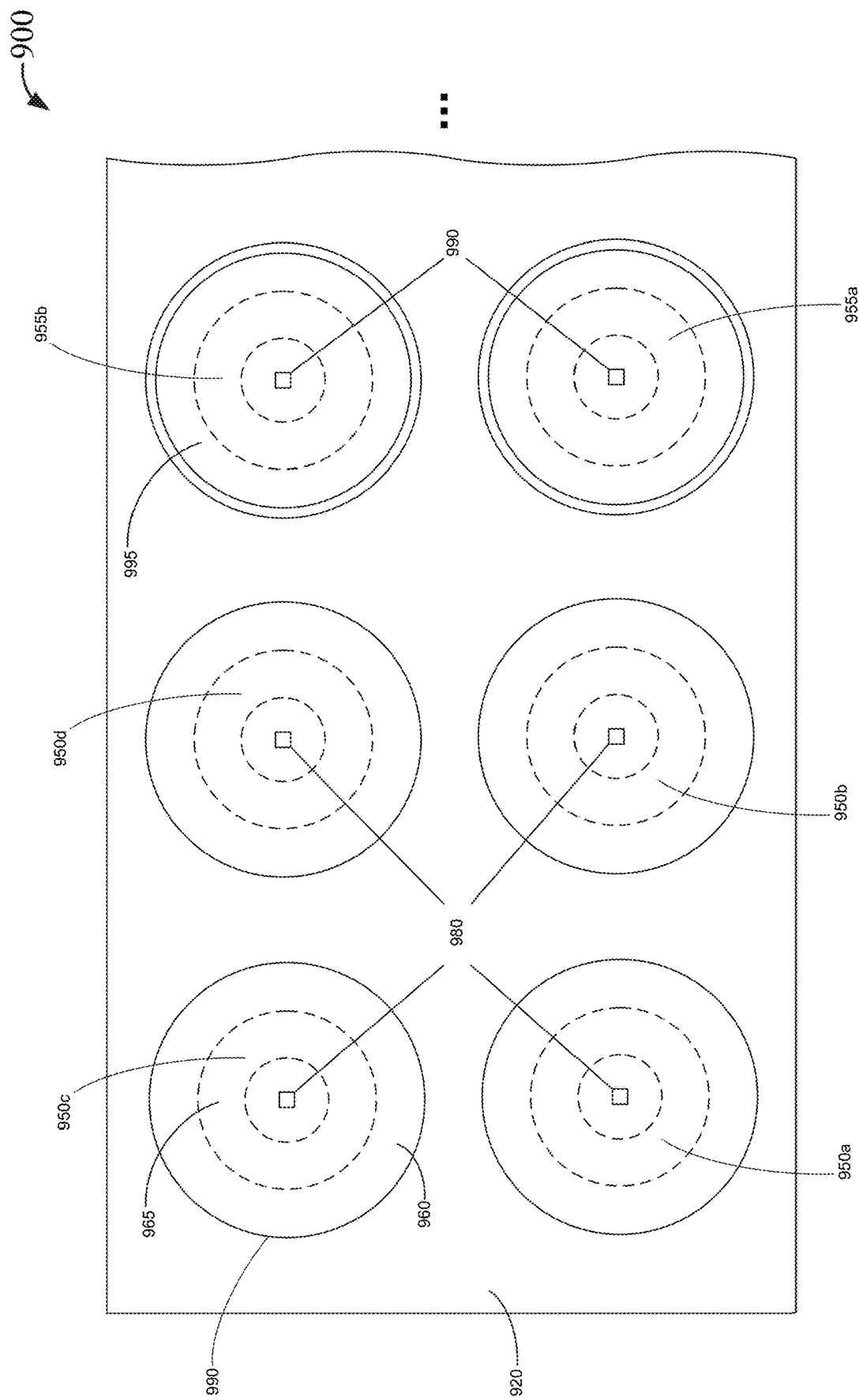
FIG. 9B illustrates a top-down view of the example LED illustrated in FIG. 9A in which one or more embodiments may be implemented.

In some embodiments, an LED array may include more than one non-light emitting mesa structure, such as structure 850, and/or more than one light-emitting mesa structure, such as structure 855. FIGS. 9A and 9B illustrate an exemplary LED array 900 which includes structures 950a, 950b, 950c, and 950d, which may be non-light emitting mesa structures. In some embodiments, structures 950a, 950b, 950c, and 950d may be similar to structure 850 in material and function. FIGS. 9A and 9B may also include two structures 955a and 955b, which may be light-emitting structures. In some embodiments, structures 955a and 955b may be similar to structure 855 in material and function. In various embodiments, an LED array may include a first number of non-light emitting mesa structures serving a second number of light-emitting mesa structures. Just as an illustrative example, LED array 900 may include N rows, with each row having 2 non-light emitting mesa structure and 1080 light-emitting mesa structures, N being a positive integer. In that example, there would be a total number of 2*N non-light emitting mesa structures, which serve as N contacts for a total number of 1018*N light-emitting mesa structures.

FIG. 9A illustrates a cross-sectional view of LED array 900 and only depicts a cross-section of structures 950a, 950b, and 955a. Structures 950c, 950d, and 950b are in the background and are hidden in the cross-sectional view, however, it is understood that they are present. Each of structures 950a-d and structures 955a-b may include multiple epitaxial layers grown on substrate 910. Substrate 910 may be similar to substrate 810 in material and function, and the epitaxial layers grown thereon may be grown by any of the techniques described herein. In some embodiments, structures 950a-d may be similar to structure 850 in material and function and structures 955a-b may be similar to structure 855 in material and function. Structures 950a-d may have a mesa shape formed from a semiconductor layer 920, active layers 930, and a semiconductor layer 940. Structures 955a-b may have a mesa shaped formed from semiconductor layer 920, semiconductor layer 945, and active layers 935. Semiconductor layer 920 may be similar to semiconductor layer 820 in material and function, active layers 930 and active layers 935 may be similar to active layers 930 and active layers 935, respectively, in material and function, and semiconductor layer 940 and semiconductor layer 945 may be similar to semiconductor layer 840 and semiconductor layer 845, respectively, in material and function. Structures 950a-d may each include contact layer 980, which as shown may be an n-contact bond bump. Structures 955a-b may each include a contact layer 985, which as shown may be a p-contact bond bump. Contact layers 980 and contact layers 985 may be similar to contact layers 880 and 885, respectively, in material and function. Structures 955a-b may include a passivation layer 975 which, in some embodiments, may be similar to passivation layers 770 and/or 875 in material and function.

As illustrated in FIG. 9A, structures 950a-d may include semi-polar facets 965 and a C-plane facet 960. Semi-polar facets 965 and C-plane facet 960 may be similar to semi-polar facets 865 and C-plane facet 860, respectively, in material and function. Because, as illustrated in the example of FIGS. 9A and 9B, there is a plurality of non-light emitting mesa structures for a given light-emitting mesa structure, the overall surface area for current 905 to flow between contact layers 985 to contact layers 980 through semiconductor layer 920 may be increased. As noted above, an increased surface area may reduce the overall resistance applied to current 905 transferring between contact layers 985 and contact layers 980.

FIG. 9B illustrates a top-down view of LED array 900. In some embodiments, to form LED array 900, a mesa shape may be formed for each of structures 950a-d and 955a-b. A conductive layer 990 may be deposited to overlay at least a portion of each of the structures 950a-d. A conductive layer 995 may be also be deposited to overlay at least a portion of each of structures 955a-b. Conductive layer 990 and conductive layer 995 may be similar to conductive layer 890 and conductive layer 895, respectively, in material and function. As illustrated in FIGS. 9A and 9B, conductive layer 990 may overlay the entire mesa shape of each of structures 950a-d, as well as a portion of exposed semiconductor layer 920 around the perimeter of each structure. Conductive layer 990 may be in ohmic contact with the exposed surface of semiconductor layer 920. By forming each of the structures in this manner, the overall surface area through which current 905 may flow between contact layers 985 and contact layers 980 may be increased. From FIG. 9B, the increased surface area of C-plane facets 960 and semi-polar facets 965 may be appreciated. As noted above, semi-polar facets 965 may have a reduced overall resistance as compared to C-plane facets 960. Thus, by increasing the surface area of semi-polar facets 965, contact resistance to current 905 may be reduced.

Figure 10A:
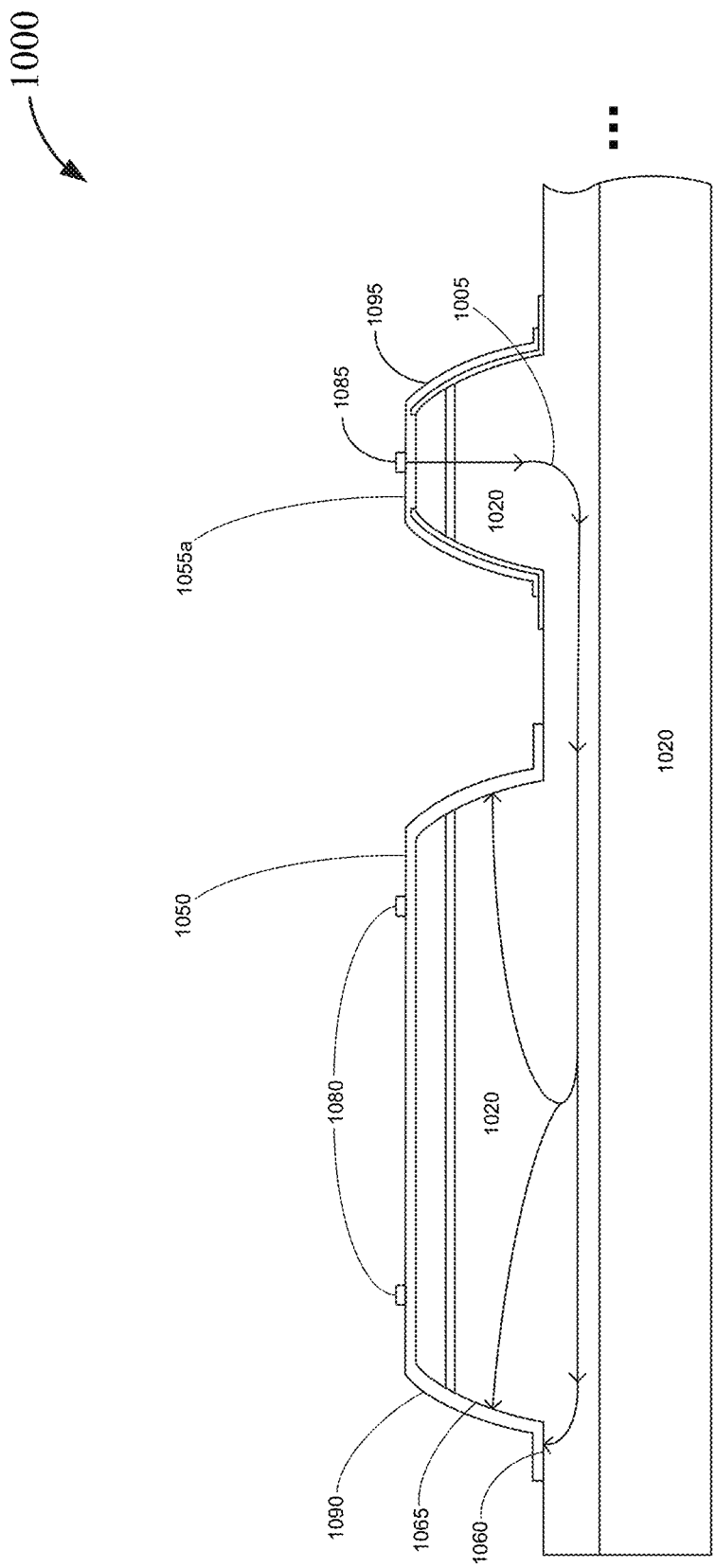
FIG. 10A illustrates a cross-sectional view of another example LED in which one or more embodiments may be implemented.
Figure 10B:
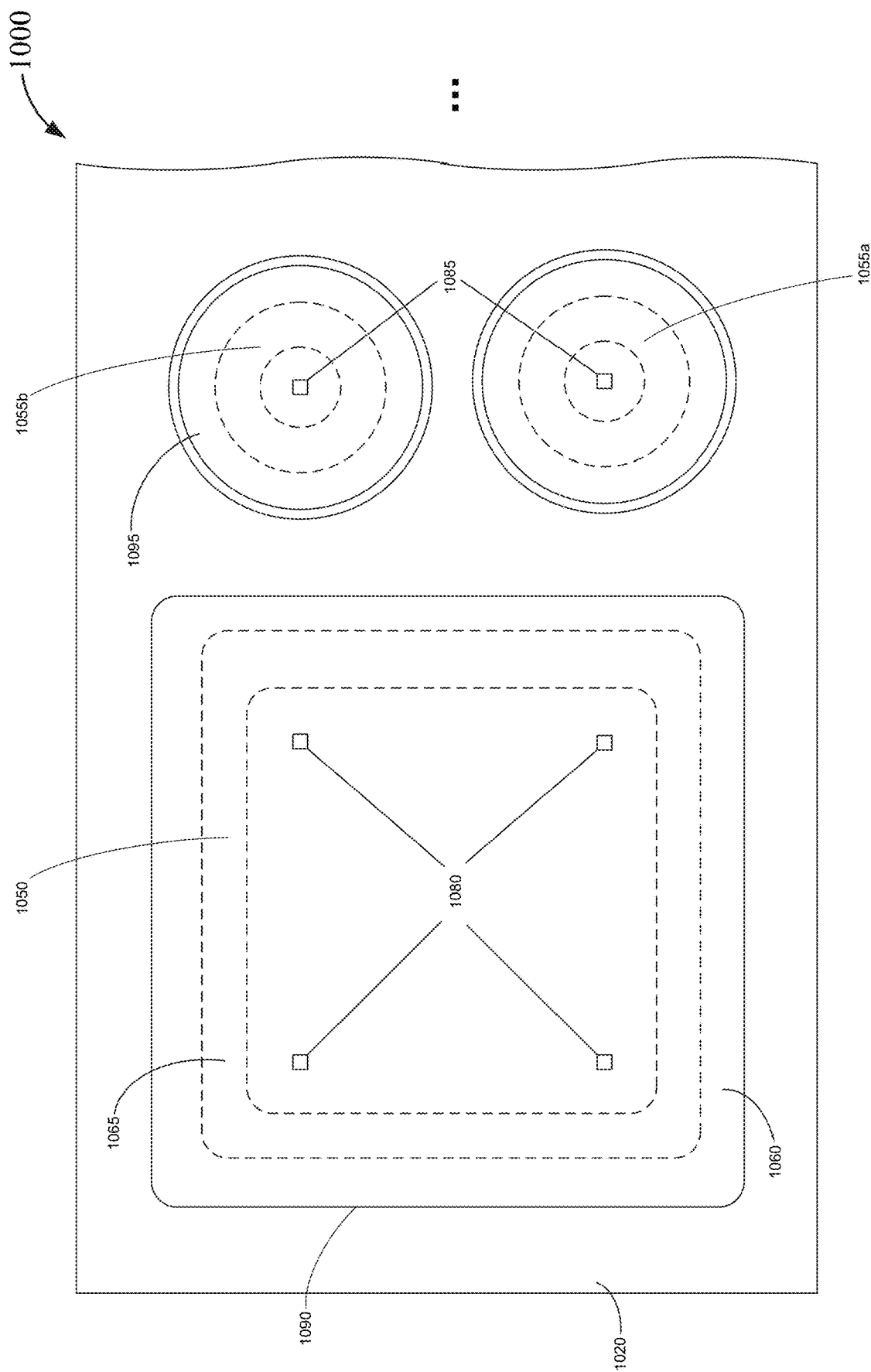
FIG. 10B illustrates a top-down view of the example LED illustrated in FIG. 10A in which one or more embodiments may be implemented.

In some embodiments, the mesa shape of the non-light emitting mesa structure and the light-emitting mesa structure may be different. FIGS. 10A and 10B illustrate an example LED array 1000 showing one such configuration. FIG. 10A illustrates a cross-sectional view of LED array 1000 including a structure 1050 and structure 1055a. LED array 1000 also includes structure 1055b, which may be similar to structure 1055a, in material and function. Structure 1055b is hidden in the cross-sectional view, however, it is understood that it is present. Structure 1050 may be a non-light emitting mesa structure, such as structure 850 and structures 950a-d. Structure 1050 may be similar to structure 850 and/or structures 950a-d, in material and function, except that the mesa shape in structure 1050 may be different than the corresponding mesa shapes of structure 850 and structures 1050a-b. Structures 1055a-b may be light emitting structures, such as structure 855 and structures 955a-b. Structure 1050 may have a mesa shape of any shape, but as shown in FIGS. 10A and 10B structure 1050 may have a rectangular plateau shape. Structure 1050 and structures 1055a-b may be formed from the same or common epitaxial layers grown on substrate 1010. Substrate 1010 may be similar to any previously discussed substrate in material and function.

Structure 1050 may vary from previously discussed structures 850 and 950a-d in that structure 1050 may include more than one contact layer 1080. FIG. 10B illustrates a top-down view of LED array 1000 and illustrates that structure 1050 may include four contact layers 1080. In some embodiments, structure 1050 may include more than four contact layers 1080, while in other embodiments structure 1050 may include less than four contact layers 1080. Contact layers 1080 may be similar to contact layers 980 and/or contact layer 880 in material and function. Here, contact layers 1080 may be n-contact bump bonds. LED array 1000 may also include contact layers 1085 positioned on top of structures 1055a-b. Contact layers 1085 may be similar to contact layers 985 and/or contact layer 885 in material and function. As illustrated in FIGS. 10A and 10B, contact layers 1085 may be p-contact bump bonds.

A conductive layer 1090 may overlay at least a portion of the mesa shape of structure 1050. A conductive layer 1095 may overlay at least a portion of the mesa shape of structures 1055a-b. Conductive layer 1090 and conductive layer 1095 may be similar to conductive layers 990 and/or 890, and conductive layers 996 and/or 895, respectively, in material and function. As illustrated in FIG. 10B, a top portion of conductive layer 1090 may have a rectangular shape and overlay the entire mesa shape of structure 1050. Similarly, a top portion of conductive layer 1095 may have a circular shape and overlay each entire mesa shape of structures 1055a-b. Conductive layer 1090 may also overlay a portion of the perimeter of structure 1050. During the etching of the mesa shapes for structures 1050 and 1055a-b, the epitaxial layers may be etched to expose a semiconductor layer 1020 between the mesa shapes. Here, semiconductor layer 1020 may be an N-type doped semiconductor material, such as semiconductor layer 920 and 820. As noted above, by extending conductive layer 1090 to overlay a perimeter portion of the exposed semiconductor layer 1020, conductive layer 1090 may form a C-plane facet 1060 through which a current 1005 may flow from contact layers 1085 to contact layers 1080. The mesa sidewalls of structure 1050 may form semi-polar facets 1065. Semi-polar facets 1065 may be similar to semi-polar facets 965 and 865, in material and function. Current 1005 may also flow via semi-polar facets 1065 from contact layers 1080 to contact layers 1085. The mesa shape of structure 1050 may provide for a larger surface area of semi-polar facets 1065 as compared to the surface area of semi-polar facets 865 formed on structure 850. By varying the size and mesa shape of structure 1050, the surface area of semi-polar facets 1065 and the "semi-polarity" of semi-polar facets 1065 may be increased or decreased as discussed previously. The surface area of C-plane facet 1060 may also be varied depending on the portion of the perimeter which is contacted by conductive layer 1090. In some embodiments, one or more additional layers (not shown) may be formed over the exposed semiconductor layer 1020 between the mesa shapes of structure 1050 and structures 1055a-b. For example, a protective or cover layer may be applied over LED array 1000.

In some embodiments, the above-described LEDs having both a non-light emitting mesa structure and a light-emitting mesa structure may be used or obtained in a head-mounted display device, such as an HMD device 200, and/or a near-eye display system, such as near-eye display 300. By using an array of LEDs including a non-light emitting mesa structure, such as those described above (i.e., structure 850, 950a-d, and 1050), VR and AR systems may be able to provide more crisp and bright displays of the reduced overall resistance of each LED provided by the non-light emitting mesa structure. Moreover, the manufacturing and production of VR and AR systems utilizing LEDs as described herein may have reduced costs and increased production yields because of a reduction in processing steps required to form non-light emitting mesa structures and light-emitting mesa structures having the same mesa shape.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 11A, 11B:
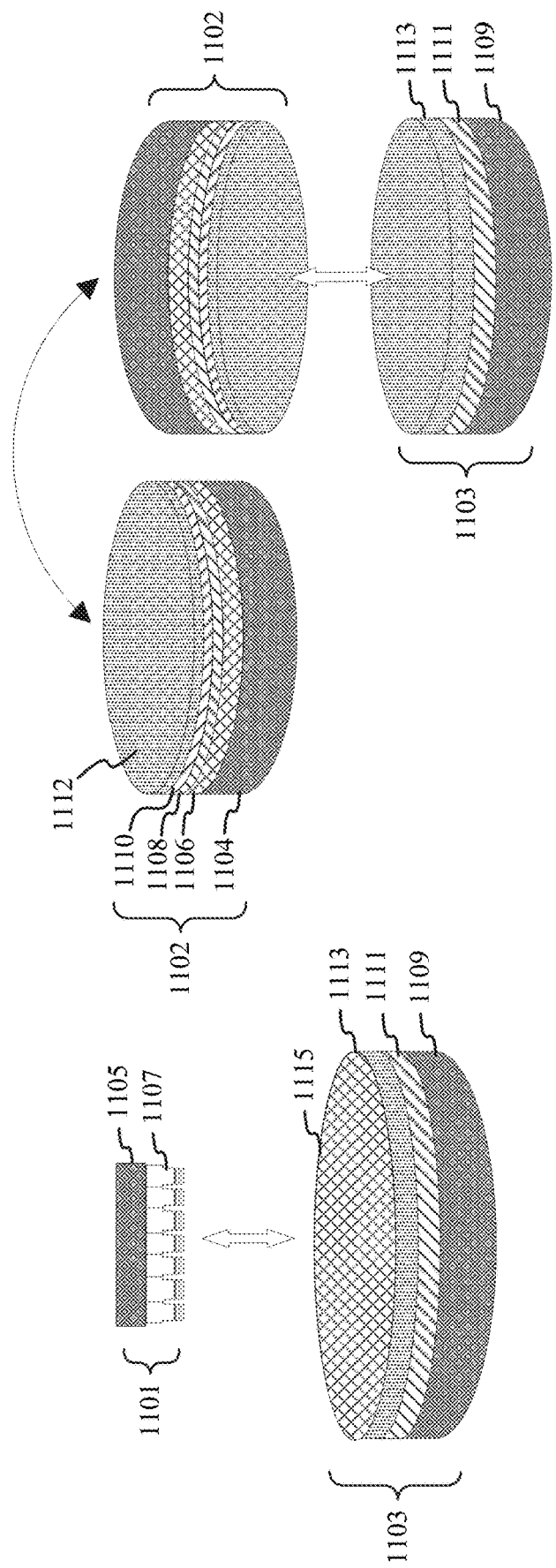
FIG. 11A illustrates an example of a method of die-to-wafer bonding for arrays of LEDs according to certain embodiments.
FIG. 11B illustrates an example of a method of wafer-to-wafer bonding for arrays of LEDs according to certain embodiments.

FIG. 11A illustrates an example of a method of die-to-wafer bonding for arrays of LEDs according to certain embodiments. In the example shown in FIG. 11A, an LED array 1101 may include a plurality of LEDs 1107 on a carrier substrate 1105. Carrier substrate 1105 may include various materials, such as GaAs, InP, GaN, AlN, sapphire, SiC, Si, or the like. LEDs 1107 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an N-type layer, a P-type layer, and an active layer that includes one or more heterostructures, such as one or more quantum wells or MQWs. The electrical contacts may include various conductive materials, such as a metal or a metal alloy.

A wafer 1103 may include a base layer 1109 having passive or active integrated circuits (e.g., driver circuits 1111) fabricated thereon. Base layer 1109 may include, for example, a silicon wafer. Driver circuits 1111 may be used to control the operations of LEDs 1107. For example, the driver circuit for each LED 1107 may include a 2T1C pixel structure that has two transistors and one capacitor. Wafer 1103 may also include a bonding layer 1113. Bonding layer 1113 may include various materials, such as a metal, an oxide, a dielectric, CuSn, AuTi, and the like. In some embodiments, a patterned layer 1115 may be formed on a surface of bonding layer 1113, where patterned layer 1115 may include a metallic grid made of a conductive material, such as Cu, Ag, Au, Al, or the like.

LED array 1101 may be bonded to wafer 1103 via bonding layer 1113 or patterned layer 1115. For example, patterned layer 1115 may include metal pads or bumps made of various materials, such as CuSn, AuSn, or nanoporous Au, that may be used to align LEDs 1107 of LED array 1101 with corresponding driver circuits 1111 on wafer 1103. In one example, LED array 1101 may be brought toward wafer 1103 until LEDs 1107 come into contact with respective metal pads or bumps corresponding to driver circuits 1111. Some or all of LEDs 1107 may be aligned with driver circuits 1111, and may then be bonded to wafer 1103 via patterned layer 1115 by various bonding techniques, such as metal-to-metal bonding. After LEDs 1107 have been bonded to wafer 1103, carrier substrate 1105 may be removed from LEDs 1107.

FIG. 11B illustrates an example of a method of wafer-to-wafer bonding for arrays of LEDs according to certain embodiments. As shown in FIG. 11B, a first wafer 1102 may include a substrate 1104, a first semiconductor layer 1106, active layers 1108, and a second semiconductor layer 1110. Substrate 1104 may include various materials, such as GaAs, InP, GaN, AlN, sapphire, SiC, Si, or the like. First semiconductor layer 1106, active layers 1108, and second semiconductor layer 1110 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1106 may be an N-type layer, and second semiconductor layer 1110 may be a P-type layer. For example, first semiconductor layer 1106 may be an n-doped GaN layer (e.g., doped with Si or Ge), and second semiconductor layer 1110 may be a p-doped GaN layer (e.g., doped with Mg, Ca, Zn, or Be). Active layers 1108 may include, for example, one or more GaN layers, one or more InGaN layers, one or more AlInGaP layers, and the like, which may form one or more heterostructures, such as one or more quantum wells or MQWs.

In some embodiments, first wafer 1102 may also include a bonding layer. Bonding layer 1112 may include various materials, such as a metal, an oxide, a dielectric, CuSn, AuTi, or the like. In one example, bonding layer 1112 may include p-contacts and/or n-contacts (not shown). In some embodiments, other layers may also be included on first wafer 1102, such as a buffer layer between substrate 1104 and first semiconductor layer 1106. The buffer layer may include various materials, such as polycrystalline GaN or AlN. In some embodiments, a contact layer may be between second semiconductor layer 1110 and bonding layer 1112. The contact layer may include any suitable material for providing an electrical contact to second semiconductor layer 1110 and/or first semiconductor layer 1106.

First wafer 1102 may be bonded to wafer 1103 that includes driver circuits 1111 and bonding layer 1113 as described above, via bonding layer 1113 and/or bonding layer 1112. Bonding layer 1112 and bonding layer 1113 may be made of the same material or different materials. Bonding layer 1113 and bonding layer 1112 may be substantially flat. First wafer 1102 may be bonded to wafer 1103 by various methods, such as metal-to-metal bonding, eutectic bonding, metal oxide bonding, anodic bonding, thermo-compression bonding, ultraviolet (UV) bonding, and/or fusion bonding.

As shown in FIG. 11B, first wafer 1102 may be bonded to wafer 1103 with the p-side (e.g., second semiconductor layer 1110) of first wafer 1102 facing down (i.e., toward wafer 1103). After bonding, substrate 1104 may be removed from first wafer 1102, and first wafer 1102 may then be processed from the n-side. The processing may include, for example, the formation of certain mesa shapes for individual LEDs, as well as the formation of optical components corresponding to the individual LEDs.

FIGS. 12A-12D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 12A shows a substrate 1210 with passive or active circuits 1220 manufactured thereon. As described above with respect to FIGS. 11A-11B, substrate 1210 may include, for example, a silicon wafer. Circuits 1220 may include driver circuits for the arrays of LEDs. A bonding layer may include dielectric regions 1240 and contact pads 1230 connected to circuits 1220 through electrical interconnects 1222. Contact pads 1230 may include, for example, Cu, Ag, Au, Al, W, Mo, Ni, Ti, Pt, Pd, or the like. Dielectric materials in dielectric regions 1240 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1205. The activated surface may be atomically clean and may be reactive for formation of direct bonds between wafers when they are brought into contact, for example, at room temperature.

FIG. 12B illustrates a wafer 1250 including an array of micro-LEDs 1270 fabricated thereon as described above with respect to, for example, FIGS. 7-11B. Wafer 1250 may be a carrier wafer and may include, for example, GaAs, InP, GaN, AlN, sapphire, SiC, Si, or the like. Micro-LEDs 1270 may include an N-type layer, an active region, and a P-type layer epitaxially grown on wafer 1250. The epitaxial layers may include various III-V semiconductor materials described above, and may be processed from the P-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1280 and n-contacts 1282 may be formed in a dielectric material layer 1260 deposited on the mesa structures and may make electrical contacts with the P-type layer and the N-type layers, respectively. Dielectric materials in dielectric material layer 1260 may include, for example, SiCN, $SiO_2$, SiN, $Al_2O_3$, $HfO_2$, $ZrO_2$, $Ta_2O_5$, or the like. P-contacts 1280 and n-contacts 1282 may include, for example, Cu, Ag, Au, Al, W, Mo, Ni, Ti, Pt, Pd, or the like. The top surfaces of p-contacts 1280, n-contacts 1282, and dielectric material layer 1260 may form a bonding layer. The bonding layer may be planarized and polished using, for example, chemical mechanical polishing, where the polishing may cause dishing in p-contacts 1280 and n-contacts 1282. The bonding layer may then be cleaned and activated by, for example, an ion (e.g., plasma) or fast atom (e.g., Ar) beam 1215. The activated surface may be atomically clean and reactive for formation of direct bonds between wafers when they are brought into contact, for example, at room temperature.

FIG. 12C illustrates a room temperature bonding process for bonding the dielectric materials in the bonding layers. For example, after the bonding layer that includes dielectric regions 1240 and contact pads 1230 and the bonding layer that includes p-contacts 1280, n-contacts 1282, and dielectric material layer 1260 are surface activated, wafer 1250 and micro-LEDs 1270 may be turned upside down and brought into contact with substrate 1210 and the circuits formed thereon. In some embodiments, compression pressure 1225 may be applied to substrate 1210 and wafer 1250 such that the bonding layers are pressed against each other. Due to the surface activation and the dishing in the contacts, dielectric regions 1240 and dielectric material layer 1260 may be in direct contact because of the surface attractive force, and may react and form chemical bonds between them because the surface atoms may have dangling bonds and may be in unstable energy states after the activation. Thus, the dielectric materials in dielectric regions 1240 and dielectric material layer 1260 may be bonded together with or without heat treatment or pressure.

FIG. 12D illustrates an annealing process for bonding the contacts in the bonding layers after bonding the dielectric materials in the bonding layers. For example, contact pads 1230 and p-contacts 1280 or n-contacts 1282 may be bonded together by annealing at, for example, about 200-400° C. or higher. During the annealing process, heat 1235 may cause the contacts to expand more than the dielectric materials (due to different coefficients of thermal expansion), and thus may close the dishing gaps between the contacts such that contact pads 1230 and p-contacts 1280 or n-contacts 1282 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the N-type layer of the micro-LEDs. In some embodiments, the secondary optical components may be fabricated in a dielectric layer deposited on the N-type side of the micro-LEDs. Examples of the secondary optical components may include a lens, a grating, an antireflection (AR) coating, a prism, a photonic crystal, or the like.

Figure 13:
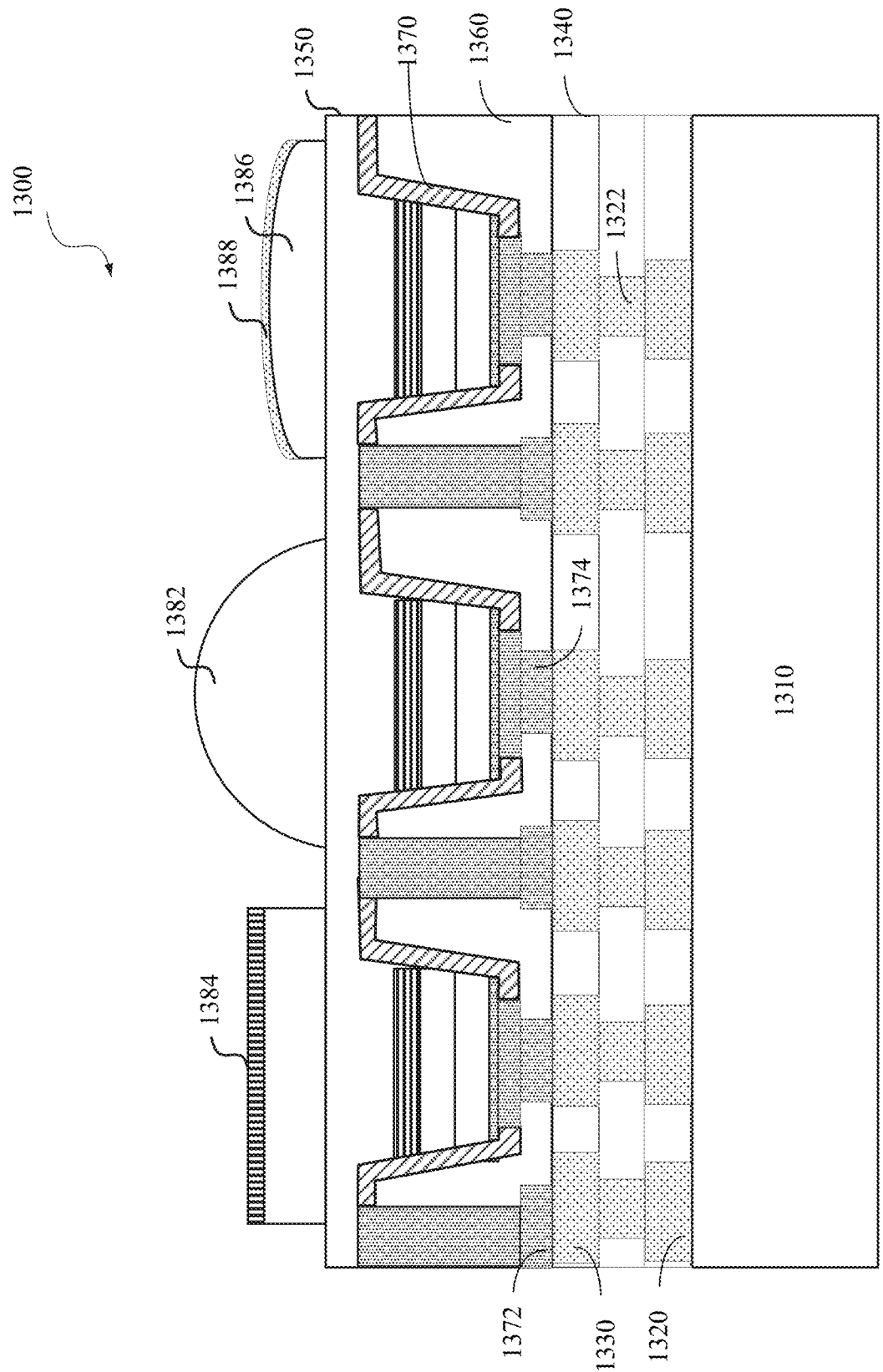
FIG. 13 illustrates an example of an LED array with secondary optical components fabricated thereon according to certain embodiments.

FIG. 13 illustrates an example of an LED array 1300 with secondary optical components fabricated thereon according to certain embodiments. LED array 1300 may be made by bonding an LED chip or wafer with a silicon wafer including electrical circuits fabricated thereon, using any suitable bonding techniques described above with respect to, for example, FIGS. 11A-12D. In the example shown in FIG. 13, LED array 1300 may be bonded using a wafer-to-wafer hybrid bonding technique as described above with respect to FIG. 11A-12D. LED array 1300 may include a substrate 1310, which may be, for example, a silicon wafer. Integrated circuits 1320, such as LED driver circuits, may be fabricated on substrate 1310. Integrated circuits 1320 may be connected to p-contacts 1374 and n-contacts 1372 of micro-LEDs 1370 through interconnects 1322 and contact pads 1330, where contact pads 1330 may form metallic bonds with p-contacts 1374 and n-contacts 1372. Dielectric layer 1340 on substrate 1310 may be bonded to dielectric layer 1360 through fusion bonding.

The substrate (not shown) of the LED chip or wafer may be thinned or may be removed to expose the N-type layer 1350 of micro-LEDs 1370. Various secondary optical components, such as a spherical micro-lens 1382, a grating 1384, a micro-lens 1386, an antireflection layer 1388, and the like, may be formed in or on top of N-type layer 1350. For example, spherical micro-lens arrays may be etched in the semiconductor materials of micro-LEDs 1370 using a gray-scale mask and a photoresist with a linear response to exposure light, or using an etch mask formed by thermal reflowing of a patterned photoresist layer. The secondary optical components may also be etched in a dielectric layer deposited on N-type layer 1350 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, $SiCN$, $SiO_2$, $SiN$, $Al_2O_3$, $HfO_2$, $ZrO_2$, $Ta_2O_5$, or the like. In some embodiments, a micro-LED 1370 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 13 to show some examples of secondary optical components that can be formed on micro-LEDs 1370, which does not necessary imply that different secondary optical components are used simultaneously for every LED array.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described using sequential terms, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An apparatus comprising:
a first three-dimensional (3-D) structure comprising a first-type doped semiconductor material having a semi-polar facet;
a conductive layer at least partially overlaying and in ohmic contact with the semi-polar facet; and
a second 3-D structure forming a light-emitting diode (LED), wherein:
the second 3-D structure comprises a second-type doped semiconductor material, an active layer, and the first-type doped semiconductor material,
the conductive layer is configured to carry a current that flows between the semi-polar facet and the active layer,
the first 3-D structure further comprises an active layer separate from the active layer of the second 3-D structure, and
the current that flows between the semi-polar facet and the active layer of the second 3-D structure bypasses the active layer of the first 3-D structure due to a resistivity of a conductive path through the semi-polar facet being lower than that of a conductive path through the active layer of the first 3-D structure.

2. The apparatus of claim 1, wherein the first-type doped semiconductor material of the first 3-D structure and the first-type doped semiconductor material of the second 3-D structure are etched from a common first-type doped semiconductor epitaxial layer.

3. The apparatus of claim 1, wherein the first-type doped semiconductor material comprises an N-type doped semiconductor material, and wherein the second-type doped semiconductor material comprises a P-type doped semiconductor material.

4. The apparatus of claim 3, wherein the N-type doped semiconductor material comprises aluminum indium gallium phosphide (AlInGaP).

5. The apparatus of claim 3, wherein the N-type doped semiconductor material comprises a III-Nitride material.

6. The apparatus of claim 1, wherein the first 3-D structure and the second 3-D structure have substantially similar heights.

7. The apparatus of claim 6, wherein the first 3-D structure and the second 3-D structure have substantially similar mesa shapes.

8. The apparatus of claim 7, wherein each of the first 3-D structure and the second 3-D structure has a parabolic shape.

9. The apparatus of claim 6, wherein the first 3-D structure and the second 3-D structure have different shapes.

10. The apparatus of claim 9, wherein the first 3-D structure has a rectangular plateau shape, and the second 3-D structure has a parabolic shape.

11. The apparatus of claim 1, wherein:
the conductive layer at least partially overlays the first 3-D structure and supports an N-contact bump bond for the LED,
a second conductive layer at least partially overlays the second 3-D structure and supports a P-contact bump bond for the LED, and
the N-contact bump bond and the P-contact bump bond have similar heights with respect to a substrate on which the first 3-D structure and the second 3-D structure are formed.

12. The apparatus of claim 1, wherein:
the first 3-D structure further comprises the second-type doped semiconductor material,
the second-type doped semiconductor material of the first 3-D structure and the second-type doped semiconductor material of the second 3-D structure are etched from a common second-type doped semiconductor epitaxial layer, and
the active layer of the first 3-D structure and the active layer of the second 3-D structure are etched from a common epitaxial layer.

13. The apparatus of claim 12, wherein the conductive layer further overlays, at least partially, surfaces of the second-type doped semiconductor material and the active layer of the first 3-D structure.

14. The apparatus of claim 1, wherein the first-type doped semiconductor material of the first 3-D structure further includes a C-plane facet, and wherein the conductive layer further overlays, at least partially, and is in ohmic contact with, the C-plane facet.

15. The apparatus of claim 1, wherein the conductive layer comprises a metal.

16. The apparatus of claim 1, wherein the conductive layer comprises a transparent conducting oxide.

17. The apparatus of claim 1, wherein the conductive layer extends along an entire perimeter of the first 3-D structure.

18. The apparatus of claim 1, wherein the first 3-D structure has a mesa shape, wherein the conductive layer at least partially overlays the mesa shape, and wherein a contact bump bond is formed on a top portion of the conductive layer.

19. The apparatus of claim 18, wherein the conductive layer at least partially overlays a C-plane facet of the first 3-D structure, and wherein the conductive layer is configured to permit current to flow: through the C-plane facet and the semi-polar facet, into the conductive layer, and to the contact bump bond.

20. The apparatus of claim 19, wherein the contact bump bond is an N-contact bump bond for the LED.

\* \* \* \* \*